(12) United States Patent
Park et al.

(10) Patent No.: US 12,354,687 B2
(45) Date of Patent: Jul. 8, 2025

(54) COMMAND ADDRESS CONTROL CIRCUIT, AND SEMICONDUCTOR APPARATUS AND SEMICONDUCTOR SYSTEM INCLUDING THE COMMAND ADDRESS CONTROL CIRCUIT

(71) Applicant: SK hynix Inc., Icheon-si Gyeonggi-do (KR)

(72) Inventors: Ji Hwan Park, Icheon-si Gyeonggi-do (KR); Kyung Hoon Kim, Icheon-si Gyeonggi-do (KR); Se Ra Jeong, Icheon-si Gyeonggi-do (KR); Ha Jun Jeong, Icheon-si Gyeonggi-do (KR); Jae Hoon Cha, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 5 days.

(21) Appl. No.: 18/460,046

(22) Filed: Sep. 1, 2023

(65) Prior Publication Data

US 2024/0257891 A1    Aug. 1, 2024

(30) Foreign Application Priority Data

Jan. 31, 2023    (KR) ........................ 10-2023-0012780

(51) Int. Cl.
  *G11C 29/12*    (2006.01)
  *G11C 7/22*    (2006.01)
  (Continued)

(52) U.S. Cl.
  CPC ........ *G11C 29/12015* (2013.01); *G11C 7/222* (2013.01); *G11C 8/10* (2013.01); *G11C 29/18* (2013.01)

(58) Field of Classification Search
  None
  See application file for complete search history.

(56) References Cited

U.S. PATENT DOCUMENTS 10,303,543 B1 *   5/2019   MacLaren ........... G06F 11/3037
12,045,615 B1 *   7/2024   Duggal ............... G06F 9/38585
(Continued)

FOREIGN PATENT DOCUMENTS

KR    1020160068369 A    6/2016
KR       101907068 B1   10/2018

OTHER PUBLICATIONS

K. Sohn et al., "A 1.2 V 30 nm 3.2 GB/s/pin 4 GB DDR4 SDRAM With Dual-Error Detection and PVT-Tolerant Data-Fetch Scheme," in IEEE Journal of Solid-State Circuits, vol. 48, No. 1, pp. 168-177, Jan. 2013, (Year: 2013).*

*Primary Examiner* — Daniel F. McMahon
(74) *Attorney, Agent, or Firm* — WILLIAM PARK & ASSOCIATES LTD.

(57) ABSTRACT

A command address control circuit includes a command decoding circuit, an error decision circuit, and a shifting circuit. The command decoding circuit detects a type of command address signal set in synchronization with a reference clock signal. The error decision circuit detects whether an error is present in the command address signal set, and generates a block signal based on the type of command address signal set and the results of the detection of an error. The shifting circuit outputs the command address signal set as an internal command address signal set based on the reference clock signal and the block signal.

25 Claims, 18 Drawing Sheets

(51) Int. Cl.
*G11C 8/10* (2006.01)
*G11C 29/18* (2006.01)

(56) References Cited

U.S. PATENT DOCUMENTS

| | | | |
|---|---|---|---|
| 2008/0163010 A1* | 7/2008 | Racunas | G06F 11/0751 |
| | | | 714/699 |
| 2010/0131708 A1* | 5/2010 | Park | G11C 13/0069 |
| | | | 711/E12.001 |
| 2011/0047411 A1* | 2/2011 | Gille | G06F 11/073 |
| | | | 711/E12.017 |
| 2012/0246409 A1* | 9/2012 | Akizuki | G06F 9/30043 |
| | | | 711/125 |
| 2013/0080826 A1* | 3/2013 | Kondo | G11C 29/824 |
| | | | 714/E11.085 |
| 2014/0250353 A1* | 9/2014 | Choi | G06F 11/1048 |
| | | | 714/800 |
| 2019/0121646 A1* | 4/2019 | Grant | G06F 9/322 |
| 2019/0348139 A1* | 11/2019 | Waldrop | G11C 29/42 |
| 2022/0223185 A1* | 7/2022 | Son | G06F 7/5443 |
| 2023/0386546 A1* | 11/2023 | Gu | G11C 11/406 |

* cited by examiner

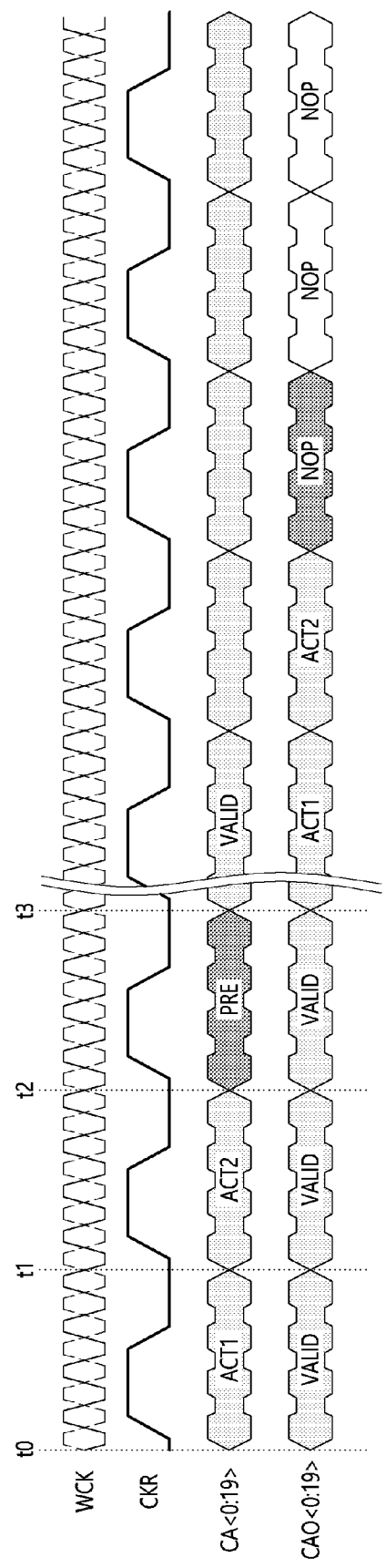

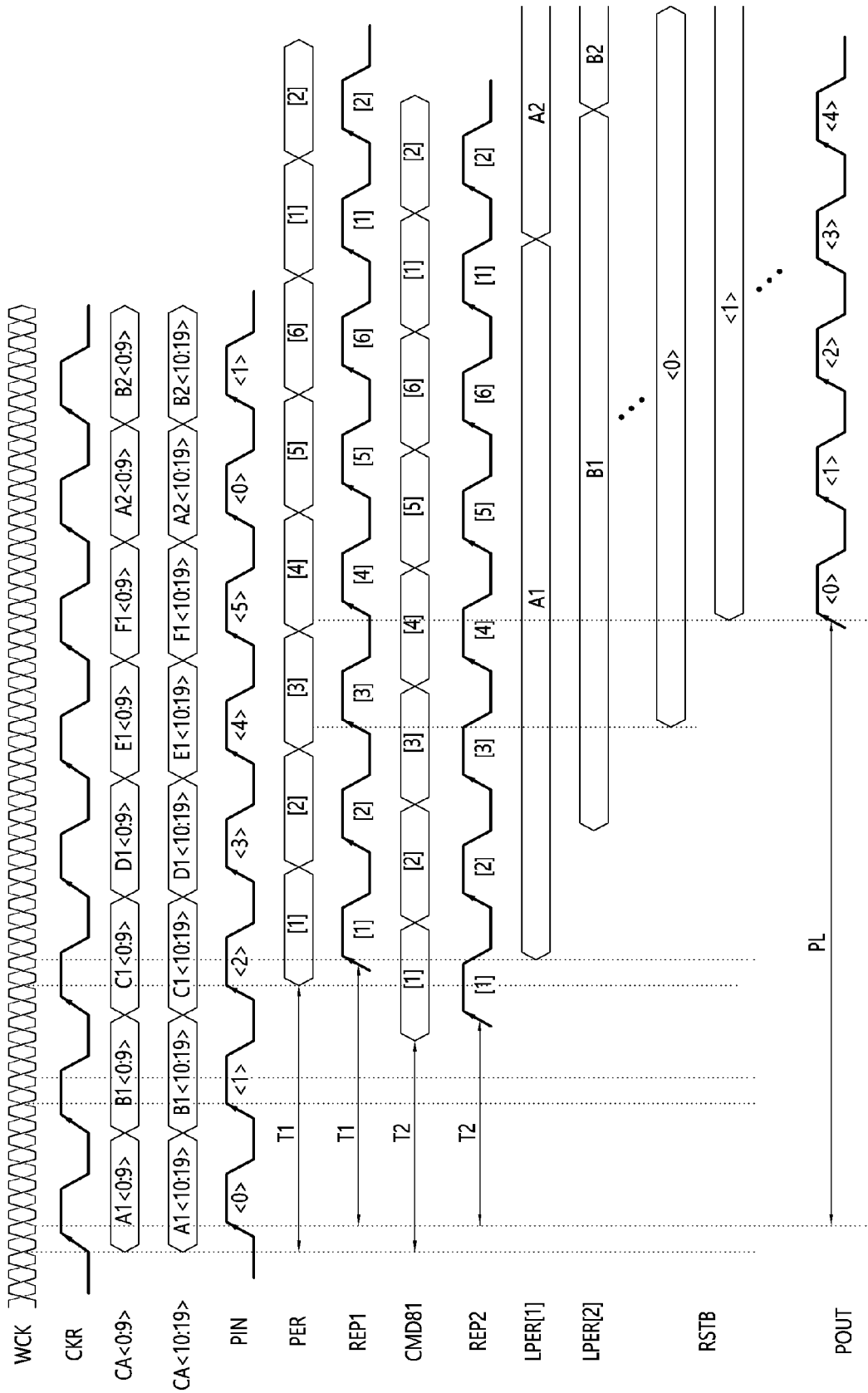

COMMAND ADDRESS CONTROL CIRCUIT, AND SEMICONDUCTOR APPARATUS AND SEMICONDUCTOR SYSTEM INCLUDING THE COMMAND ADDRESS CONTROL CIRCUIT

CROSS-REFERENCES TO RELATED APPLICATION

The present application claims priority under 35 U.S.C. § 119(a) to Korean Patent Application No. 10-2023-0012780, filed on Jan. 31, 2023, in the Korean Intellectual Property Office, which is incorporated herein by reference in its entirety.

BACKGROUND

1. Technical Field

The present technology generally relates to an integrated circuit technology, and more particularly, to a command address control circuit, and a semiconductor device and a semiconductor system including the command control circuit.

2. Related Art

An electronic device includes many electronic components. Among the electronic components, a computer system may include many semiconductor devices composed of a semiconductor. The semiconductor devices that constitute the computer system may include a processor or memory controller that operates as a master device and a memory device or storage device that operates as a slave device. The master device may provide a command address signal to the slave device. The slave device may perform various operations based on the command address signal. For example, the slave device may perform an active operation, a read operation, and a write operation based on the command address signal. The master device may provide the command address signal to the slave device in synchronization with a clock signal. As the design of the semiconductor device is integrated and the function of the semiconductor device is diversified, the number of pins or pads for transmitting and receiving the command address signals tends to be reduced. Accordingly, recently, in the semiconductor system, the command address signal sets may be transmitted and received for a plurality of clock cycles through limited command address pins or pads.

SUMMARY

According to an embodiment, a command address control circuit may include a command decoding circuit, an error decision circuit, and a shifting circuit. The command decoding circuit may be configured to generate a command detection signal by detecting the type of command address signal set in synchronization with a reference clock signal. The error decision circuit may be configured to generate an error detection signal by detecting whether an error is present in the command address signal set in synchronization with the reference clock signal and to generate a block signal based on the error detection signal and the command detection signal. The shifting circuit may be configured to output an internal command address signal set by shifting the command address signal set based on the reference clock signal and the block signal.

According to an embodiment, a command address control circuit may include a command decoding circuit, an error decision circuit, a first shifting circuit, and a second shifting circuit. The command decoding circuit may be configured to receive a command address signal set in synchronization with a first reference clock signal and to generate a command detection signal by detecting the type of command address signal set based on some command address signals of the command address signal set. The error decision circuit may be configured to generate an error detection signal by detecting whether an error is present in the command address signal set in synchronization with the first reference clock signal and a second reference clock signal and to generate a first block signal and a second block signal based on the error detection signal and the command detection signal. The first shifting circuit may be configured to generate some internal command address signals of an internal command address signal set by shifting some command address signals of the command address signal set based on the first reference clock signal, the first block signal, and the second block signal. The second shifting circuit may be configured to generate remaining internal command address signals of the internal command address signal set by shifting remaining command address signals of the command address signal set based on the second reference clock signal.

According to an embodiment, a command address control circuit may include a pipe control circuit, a command decoding circuit, a parity check circuit, a reset control circuit, and a pipe circuit. The pipe control circuit may be configured to generate an input control signal and an output control signal based on a reference clock signal. The command decoding circuit may be configured to generate a command detection signal by detecting the type of command address signal set based on the command address signal set. The parity check circuit may be configured to generate an error detection signal by detecting whether an error is present in the command address signal set. The reset control circuit may be configured to generate a reset signal, based on the reference clock signal, the error detection signal, and the command detection signal. The pipe circuit may be configured to store the command address signal set based on the input control signal, to output the stored command address signal set as an internal command address signal set based on the output control signal, and to invalidate the stored command address signal set based on the reset signal.

BRIEF DESCRIPTION OF THE DRAWINGS

FIGS. 8A, 8B, and 8C are timing diagrams illustrating operations of the semiconductor system according to embodiments.

FIG. 17 is a timing diagram illustrating an operation of the command address control circuit according to an embodiment.

DETAILED DESCRIPTION

Hereinafter, embodiments of the present technology will be described in detail with reference to the accompanying drawings.

Figure 1:
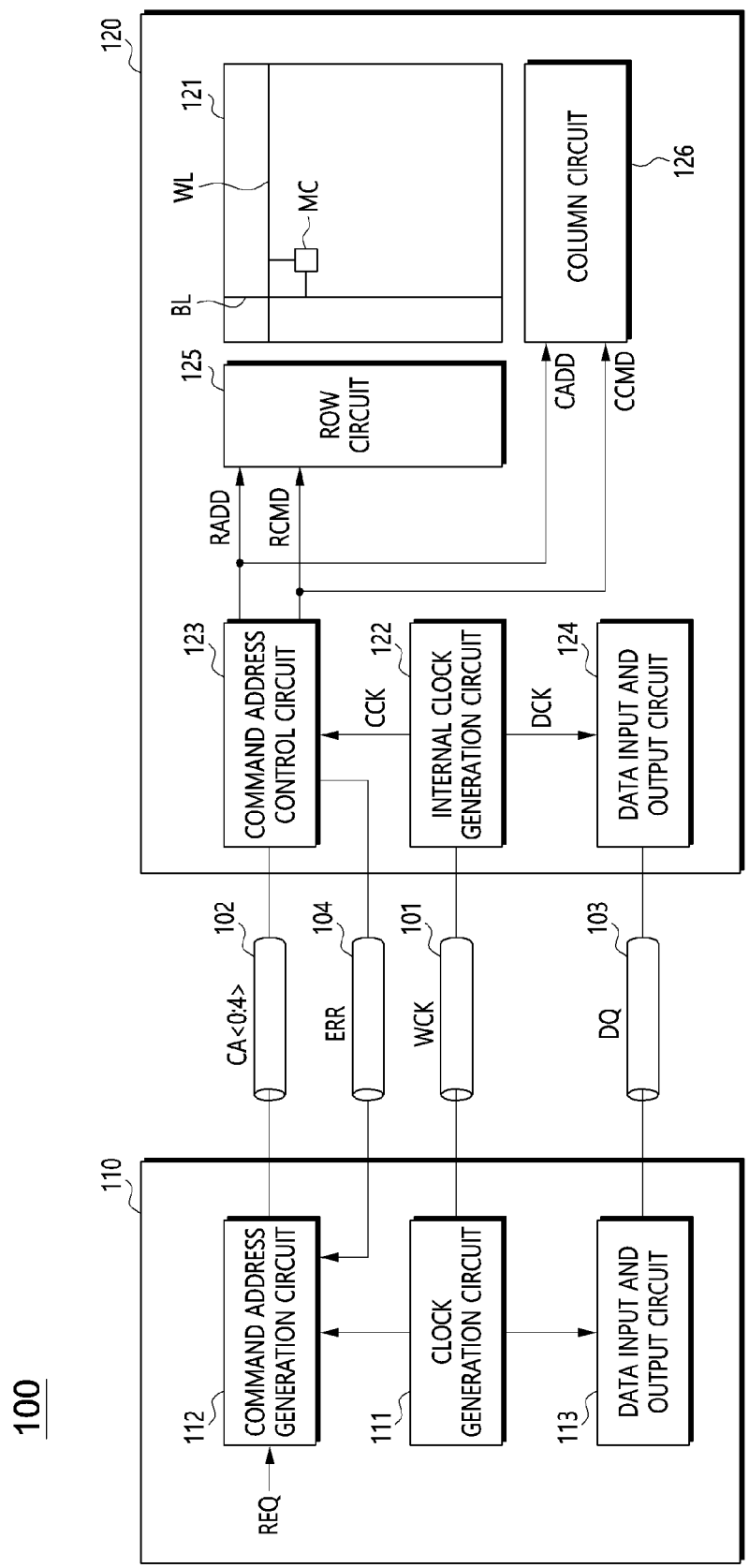
FIG. 1 is a diagram illustrating a configuration of a semiconductor system according to an embodiment.

FIG. 1 is a diagram illustrating a construction of a semiconductor system 100 according to an embodiment. In FIG. 1, the semiconductor system 100 may include a first semiconductor device 110 and a second semiconductor device 120. The first semiconductor device 110 may provide various control signals that are necessary for the second semiconductor device 120 to operate. The first semiconductor device 110 may include various types of devices. For example, the first semiconductor device 110 may be a host device, such as a central processing unit (CPU), a graphic processing unit (GPU), a multi-media processor (MMP), a digital signal processor, an application processor (AP), and a memory controller. The second semiconductor device 120 may be a memory device, for example. The memory device may include volatile memory and nonvolatile memory. The volatile memory may include static RAM (SRAM), dynamic RAM (DRAM), and synchronous DRAM (SDRAM). The nonvolatile memory may include read only memory (ROM), programmable ROM (PROM), electrically erasable PROM (EEPROM), erasable programmable ROM (EPROM), flash memory, phase change RAM (PRAM), magnetic RAM (MRAM), resistive RAM (RRAM), and ferroelectric RAM (FRAM).

The second semiconductor device 120 may be coupled to the first semiconductor device 110 through a plurality of buses. The plurality of buses may be signal transmission paths, links, or channels for outputting signals. The plurality of buses may include a clock bus 101, a command address bus 102, and a data bus 103. The clock bus 101 and the command address bus 102 may be unidirectional buses from the first semiconductor device 110 to the second semiconductor device 120. The data bus 103 may be a bidirectional bus. The second semiconductor device 120 may be coupled to the first semiconductor device 110 through the clock bus 101, and may receive a clock signal WCK through the clock bus 101. The clock signal WCK may include one or more clock signal pairs. The second semiconductor device 120 may be coupled to the first semiconductor device 110 through the command address bus 102, and may receive command address signals CA<0:4> from the first semiconductor device 110 through the command address bus 102. The command address signals CA<0:4> may include a plurality of bits. The second semiconductor device 120 may receive the command address signals CA<0:4> based on the clock signal WCK. The command address bus 102 may include five signal transmission lines. During one period of the clock signal WCK, the five bit command address signals CA<0:4> may be transmitted from the first semiconductor device 110 to the second semiconductor device 120 through the five signal transmission lines. However, the number of signal transmission lines that are included in the command address bus 102 and the number of bits of the command address signal that are transmitted during one period of the clock signal WCK may be variously changed.

The second semiconductor device 120 may be coupled to the first semiconductor device 110 through the data bus 103, and may receive data DQ from the first semiconductor device 110 or transmit the data DQ to the first semiconductor device 110 through the data bus 103. An operation of the data DQ being transmitted from the first semiconductor device 110 to the second semiconductor device 120 may be defined as a data input operation and/or a write operation. An operation of the data DQ being transmitted from the second semiconductor device 120 to the first semiconductor device 110 may be defined as a data output operation and/or a read operation. In an embodiment, the semiconductor system 100 may further include an error signal bus 104. The error signal bus 104 may be a unidirectional bus from the second semiconductor device 120 to the first semiconductor device 110, and may be a bidirectional bus. The second semiconductor device 120 may be coupled to the first semiconductor device 110 through the error signal bus 104, and may transmit an error signal ERR to the first semiconductor device 110 through the error signal bus 104.

The first semiconductor device 110 may include a clock generation circuit 111, a command address generation circuit 112, and a data input and output circuit 113. The clock generation circuit 111 may generate the clock signal WCK, and may transmit the clock signal WCK to the second semiconductor device 120 through the clock bus 101. The clock generation circuit 111 may provide the clock signal WCK to the command address generation circuit 112 and the data input and output circuit 113. The clock generation circuit 111 may generate the clock signal WCK having a frequency corresponding to an operating speed of the semiconductor system 100. In an embodiment, the clock generation circuit 111 may generate the clock signal WCK having a frequency that is greater than or smaller than a frequency corresponding to an operating speed of the semiconductor system 100. The clock generation circuit 111 may include at least one of various clock generators, such as a ring oscillator, a delay locked loop circuit, and a phase locked loop circuit, in order to generate the clock signal WCK. In an embodiment, the clock generation circuit 111 may adjust the frequency and/or phase of the clock signal WCK, and may provide the command address generation circuit 112 and/or the data input and output circuit 113 with the clock signal having the adjusted frequency and/or phase.

The command address generation circuit 112 may generate a command address signal set based on a request REQ. The command address generation circuit 112 may generate the command address signal set, including different pieces of information, based on various requests REQ. The command address generation circuit 112 may transmit the command address signals CA<0:4> to the second semiconductor device 120 through the command address bus 102 for a plurality of cycles in order to output the command address signal set. The command address signal set may include a row command address signal and a column command address signal. The row command address signal may be a signal that is used for the second semiconductor device 120 to generate a row command signal RCMD and a row address signal RADD. The column command address signal may be a signal that is used for the second semiconductor device 120 to generate a column command signal CCMD and a column address signal CADD.

The command address generation circuit 112 may receive the clock signal WCK from the clock generation circuit 111, and may output the command address signals CA<0:4> to the command address bus 102 in synchronization with the clock signal WCK. The command address generation circuit 112 may output the command address signal set to the command address bus 102 during one or more unit cycles. The unit cycle may be four cycles of the clock signal WCK, for example. The command address signal set may include two types. A command address signal set having a first type may be a 20-bit command address signal that is transmitted during four cycles of the clock signal WCK. A command address signal set having a second type may be a 40-bit command address signal that is transmitted during eight cycles of the clock signal WCK. For example, a 5-bit command address signals CA<0:4> may be transmitted through the command address bus 102 during one cycle of the clock signal WCK. The three bits CA<0:2> of the 5-bit command address signals CA<0:4> may be assigned as a row command address signal, and the two bits CA<3:4> of the 5-bit command address signals CA<0:4> may be assigned as a column command address signal. Accordingly, a row command address signal of the command address signal set having the first type may include a total of 12 bits. A row command address signal of the command address signal set having the second type may include a total of 24 bits. A column command address signal of the command address signal set having the first type may include a total of 8 bits. A column command address signal of the command address signal set having the second type may include a total of 16 bits.

The command address generation circuit 112 may transmit the command address signals CA<0:4> during four cycles of the clock signal WCK, when a command address signal set that is generated in response to the request REQ is the first type. The command address generation circuit 112 may transmit the command address signals CA<0:4> during eight cycles of the clock signal WCK when a command address signal set that is generated in response to the request REQ is the second type. At least one bit of a command address signal set that is transmitted during the unit cycle may be a parity bit for detecting an error of the command address signal set. At least one bit of a command address signal set that is transmitted during the unit cycle may include information in relation to whether the command address signal set is the first type or the second type.

The data input and output circuit 113 may be coupled to the second semiconductor device 120 through the data bus 103, and may transmit or receive the data DQ through the data bus 103. The data input and output circuit 113 may receive the clock signal WCK from the clock generation circuit 111. The data input and output circuit 113 may output internal data of the first semiconductor device 110 through the data bus 103 as the data DQ based on the clock signal CLK during a write operation. The data input and output circuit 113 may receive the data DQ that is transmitted through the data bus 103, based on the clock signal WCK during a read operation, and may generate internal data of the first semiconductor device 110 based on the data DQ.

The second semiconductor device 120 may include a memory cell array 121, an internal clock generation circuit 122, a command address control circuit 123, and a data input and output circuit 124. Although not illustrated, the memory cell array 121 may include a plurality of memory banks. A plurality of word lines WL may be disposed in a row direction and a plurality of bit lines BL may be disposed in a column direction in each of the plurality of memory banks. A plurality of memory cells MC may be coupled to points at which the plurality of word lines WL and the plurality of bit lines BL are intersected. When a specific word line among the plurality of word lines WL is selected based on the row address signal RADD and a specific bit line among the plurality of bit lines BL is selected based on the column address signal CADD, a target memory cell that is coupled between the selected word line and the selected bit line may be accessed.

The internal clock generation circuit 122 may be coupled to the clock bus 101, and may receive, through the clock bus 101, the clock signal WCK that is transmitted by the first semiconductor device 110. The internal clock generation circuit 122 may generate a plurality of internal clock signals based on the clock signal WCK. The internal clock generation circuit 122 may provide the plurality of internal clock signals to the command address control circuit 123 and the data input and output circuit 124 so that the command address control circuit 123 and the data input and output circuit 124 operate based on the clock signal WCK. The internal clock generation circuit 122 may generate a plurality of internal clock signals having various frequencies and/or various phases. The internal clock generation circuit 122 may generate a command clock signal CCK and a data clock signal DCK based on the clock signal WCK. The internal clock generation circuit 122 may generate the command clock signal CCK and the data clock signal DCK by adjusting the frequency and/or phase of the clock signal WCK. The internal clock generation circuit 122 may include a frequency divider, a frequency multiplier, and a delay locked loop circuit in order to adjust the frequency and/or phase of the clock signal WCK.

The command address control circuit 123 may be coupled to the command address bus 102, and may receive the command address signals CA<0:4> that is transmitted by the first semiconductor device 110. The command address control circuit 123 may receive an internal clock signal from the internal clock generation circuit 122. The command address control circuit 123 may receive the command clock signal CCK as the internal clock signal. The command address control circuit 123 may receive the command address signals CA<0:4> in synchronization with the command clock signal CCK. The command address control circuit 123 may generate the row command signal RCMD and the row address signal RADD, based on a row command address signal that is included in the command address signals CA<0:4>. Although being not limited, for example, the row command signal RCMD may include a no operation signal, an active signal, a mode register set signal, a precharge signal, a refresh signal, and a power-down entry and exit signal. The row command signal RCMD may include a row command signal having the first type and a row command signal having the second type. The row command signal having the first type may be a row command signal that is generated based on the command address signal set having the first type. The row command signal having the second type may be a row command signal that is generated based on the command address signal set having the second type. The command address control circuit 123 may generate the column command signal CCMD and the column address signal CADD, based on a column command address signal that is included in the command address signals CA<0:4>. Although being not limited, the column command signal CCMD may include the read signal, the write signal, a read training signal, and a write training signal. The column command signal CCMD may include a column command signal having the first type and a column command signal having the second type. The column command signal having the first type may be a column command signal that is generated based on the command address signal set having the first type. The column command signal having the second type may be a column command signal that is generated based on the command address signal set having the second type.

The command address control circuit 123 may detect the type of command address signal set based on at least one bit that is included in the command address signal set. The command address control circuit 123 may detect an error of the command address signal set, based on at least another bit that is included in the command address signal set. The command address control circuit 123 can prevent or mitigate the command address signal set from being generated as the row command signal, the row address signal, the column command signal, and the column address signal, based on the results of the detection of the type of command address signal set and the results of the detection of an error of the command address signal set. For example, when the command address signal set is the first type and an error is present in the command address signal set having the first type, the command address control circuit 123 may block the command address signal set having the first type and a command address signal set that is subsequently received. When the command address signal set is the second type, the command address control circuit 123 may detect whether the command address signal set having the second type is a command address signal set of a first phase, which is transmitted during a first unit cycle, or a command address signal set of a second phase, which is transmitted during a second unit cycle. When the command address signal set is the command address signal set of the first phase and an error is present in the command address signal set, the command address control circuit 123 may block the command address signal set of the first phase and a command address signal set that is subsequently received. When the command address signal set is the command address signal set of the second phase and an error is present in the command address signal set, the command address control circuit 123 may block the command address signal set of the second phase and a command address signal set that is subsequently received, and may also block a command address signal set of a first phase, which has been received prior to the command address signal set of the second phase. In an embodiment, when detecting that an error is present in the command address signal set, the command address control circuit 123 may generate the error signal ERR. The command address control circuit 123 may transmit the error signal ERR to the first semiconductor device 110 through the error signal bus 104. The command address generation circuit 112 of the first semiconductor device 110 may be coupled to the error signal bus 104, and may receive, through the error signal bus 104, the error signal ERR that is transmitted by the first semiconductor device 110. When receiving the error signal ERR, the command address generation circuit 112 may stop the transmission of the command address signals CA<0:4>.

The data input and output circuit 124 may be coupled to the data bus 103, and may transmit the data DQ to the first semiconductor device 110 or receive the data DQ that is transmitted by the first semiconductor device 110, through the data bus 103. The data input and output circuit 124 may receive an internal clock signal from the internal clock generation circuit 122. The data input and output circuit 124 may receive the data DQ that is transmitted by the first semiconductor device 110, in synchronization with the data clock signal DCK, and may transmit the data DQ to the first semiconductor device 110 in synchronization with the data clock signal DCK. During the write operation, the data input and output circuit 124 may generate internal data of the first semiconductor device 110 by receiving the data DQ from the first semiconductor device 110, and may provide the internal data to the memory cell array 121. During the read operation, the data input and output circuit 124 may receive internal data that is output by the memory cell array 121, and may transmit the internal data to the first semiconductor device 110 as the data DQ.

The second semiconductor device 120 may further include a row circuit 125 and a column circuit 126. The row circuit 125 may select a specific word line based on the row address signal RADD in order to access a target memory cell, among a plurality of memory cells, when an active signal that is included in the row command signal RCMD is enabled. The column circuit 126 may select a specific bit line based on the column address signal CADD in order to access a target memory cell, among a plurality of memory cells, when a read signal and a write signal that are included in the column command signal CCMD are enabled. During the read operation, the column circuit 126 may read the internal data that has been stored in the target memory cell that is coupled between the selected word line and the selected bit line, based on the read signal, and may output the internal data to the data input and output circuit 124. During the write operation, the column circuit 126 may receive the internal data that is provided by the data input and output circuit 124, based on the write signal, and may write the internal data to the target memory cell that is coupled between the selected word line and the selected bit line.

Figure 2:
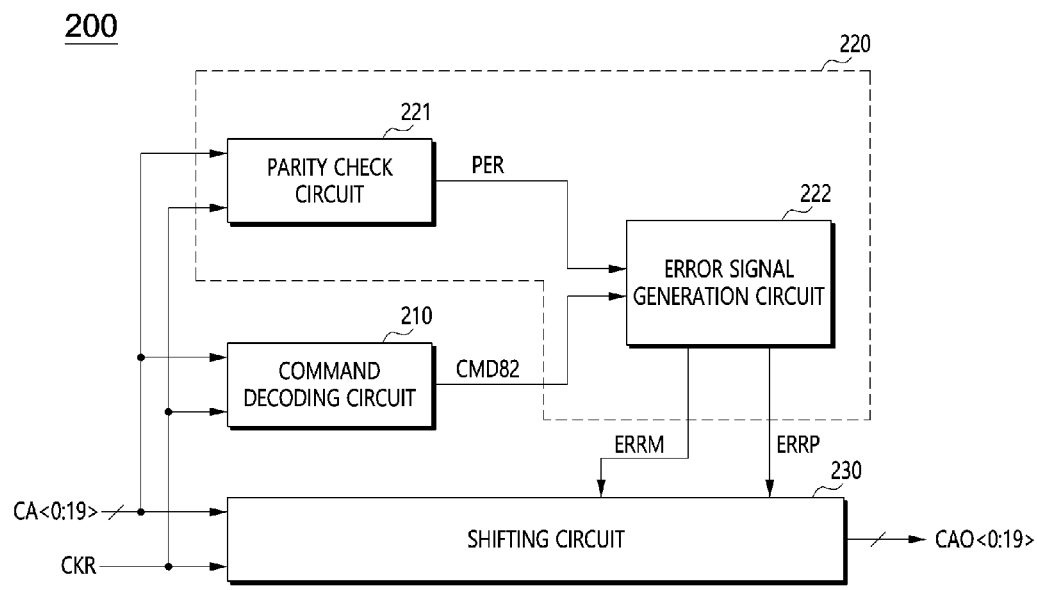
FIG. 2 is a diagram illustrating a configuration of a command address control circuit according to an embodiment.

FIG. 2 is a diagram illustrating a construction of a command address control circuit 200 according to an embodiment. The command address control circuit 200 may be applied as the command address control circuit 123 illustrated in FIG. 1. Referring to FIG. 2, the command address control circuit 200 may include a command decoding circuit 210, an error decision circuit 220, and a shifting circuit 230. The command decoding circuit 210 may receive a command address signal set CA<0:19>. The command decoding circuit 210 may receive the command address signal set CA<0:19> including a plurality of bits during unit cycle through the command address bus 102 illustrated in FIG. 1. For example, the unit cycle may be four periods of the clock signal WCK in FIG. 1, and the command decoding circuit 210 may receive five bit command address signals every one period of the clock signal WCK. The command address signal set CA<0:19> may include a command address signal including a total of 20 bits. The command decoding circuit 210 may detect the type of command address signal set CA<0:19> based on at least some bits of the command address signal set CA<0:19>. For example, the command decoding circuit 210 may detect the type of command address signal set CA<0:19> by detecting the logic level of at least one bit of the command address signal set CA<0:19>, which belongs to a specific turn. The command decoding circuit 210 may detect the type of command address signal set CA<0:19> by detecting the logic level of at least one bit in a command address signal CA<0:4> that has been received during a first period of the clock signal WCK and a command address signal CA<5:9> that has been received during a second period of the clock signal WCK, during the unit cycle. The command decoding circuit 210 may generate a command detection signal CMD82 based on first to tenth bit command address signals CA<0:9> of the command address signal set.

The command decoding circuit 210 may detect whether the command address signal set CA<0:19> is the command address signal set having the first type or the command address signal set having the second type. When the command address signal set CA<0:19> is the command address signal set having the second type, the command decoding circuit 210 may detect whether the command address signal set CA<0:19> is a command address signal set of a first phase or a command address signal set of a second phase. The command decoding circuit 210 may generate the command detection signal CMD82 based on the results of the detection of the type of command address signal set. When the command address signal set CA<0:19 is the command address signal set of the first phase having the second type, the command decoding circuit 210 may enable the command detection signal CMD82. When the command address signal set CA<0:19> is the command address signal set having the first type, the command decoding circuit 210 might not enable the command detection signal CMD82.

The command decoding circuit 210 may further receive a reference clock signal CKR. The reference clock signal CKR may be generated based on the clock signal WCK. For example, the reference clock signal CKR may be generated by dividing the frequency of the clock signal WCK. The pulse width of the reference clock signal CKR may be longer than the pulse width of the clock signal WCK. Although being not limited, the reference clock signal CKR may be generated by dividing the frequency of the clock signal WCK by 4. The command clock signal CCK illustrated in FIG. 1 may be applied as the reference clock signal CKR. The command decoding circuit 210 may detect the type of command address signal set CA<0:19> in synchronization with the reference clock signal CKR. The command decoding circuit 210 may output the command detection signal CMD82 after first latency in synchronization with the reference clock signal CKR. The first latency may be a time corresponding to three periods of the reference clock signal CKR. The command decoding circuit 210 may receive the command address signal set CA<0:19>, and may generate a preliminary command detection signal in a time corresponding to the first latency-1. The command decoding circuit 210 may generate the command detection signal CMD82 in the time corresponding to the first latency, based on the preliminary command detection signal. For example, when the command address signal set CA<0:19> is the command address signal set of the first phase having the second type, the command decoding circuit 210 may enable the preliminary command detection signal in a time that is earlier than the time corresponding to the first latency by one period of the reference clock signal CKR (i.e., after the command decoding circuit 210 receives the command address signal set CA<0:19> and two periods of the reference clock signal CKR elapse). When the preliminary command detection signal is enabled, the command decoding circuit 210 may enable the command detection signal CMD82 after one period of the reference clock signal CKR.

The error decision circuit 220 may receive the command address signal set CA<0:19>. The error decision circuit 220 may detect whether an error is present in the command address signal set CA<0:19> based on a parity bit that is included in the command address signal set CA<0:19>. The error decision circuit 220 may generate an error detection signal PER by detecting whether an error is present in the command address signal set CA<0:19>. When an error is not present in the command address signal set CA<0:19>, the error decision circuit 220 may maintain the state of the error detection signal PER to a disable state. When an error is present in the command address signal set CA<0:19>, the error decision circuit 220 may enable the error detection signal PER.

The error decision circuit 220 may receive the command detection signal CMD82 from the command decoding circuit 210. The error decision circuit 220 may generate a block signal ERRM and ERRP based on the error detection signal PER and the command detection signal CMD82. The block signal ERRM and ERRP may include a plurality of block signals. The error decision circuit 220 may maintain the state of the block signal ERRM and ERRP to a disable state when both the error detection signal PER and the command detection signal CMD82 are in the disable state. The error decision circuit 220 may enable at least some of the plurality of block signals ERRM and ERRP, when the error detection signal PER is enabled and the command detection signal CMD82 maintains the disable state. The error decision circuit 220 may enable all of the plurality of block signals of the block signal ERRM and ERRP when both the error detection signal PER and the command detection signal CMD82 are enabled.

The block signal ERRM and ERRP may include a first block signal ERRM and a second block signal ERRP. When the error detection signal PER is enabled and the command detection signal CMD82 is in the disable state, the error decision circuit 220 may enable the first block signal ERRM, and may maintain the state of the second block signal ERRP to the disable state. In other words, when an error is present in the command address signal set having the first type or the command address signal set of the first phase having the second type, the error decision circuit 220 may enable the first block signal ERRM, and may maintain the state of the second block signal ERRP to the disable state. When both the error detection signal PER and the command detection signal CMD82 are enabled, the error decision circuit 220 may enable both the first block signal ERRM and the second block signal ERRP. In other words, when an error is present in the command address signal set of the second phase having the second type, the error decision circuit 220 may enable the first block signal ERRM and the second block signal ERRP.

The error decision circuit 220 may further receive the reference clock signal CKR. The error decision circuit 220 may generate the error detection signal PER and the block signal ERRM and ERRP in synchronization with the reference clock signal CKR. The error decision circuit 220 may generate the block signal ERRM and ERRP after second latency. A time corresponding to the second latency may be shorter than the time corresponding to the first latency. For example, the second latency may be a time corresponding to a two and half (2.5) period of the reference clock signal CKR.

The error decision circuit 220 may include a parity check circuit 221 and an error signal generation circuit 222. The parity check circuit 221 may receive the command address signal set CA<0:19>, and may generate the error detection signal PER by detecting whether an error is present in the command address signal set CA<0:19>. The parity check circuit 221 may detect whether the error is present based on the logic levels of 19 bit command address signals and one bit parity that are included in the command address signal set CA<0:19>. For example, when the logic level of the one bit parity is a logic high level, the parity check circuit 221 may determine whether the number of bits having a logic high level, in the command address signal set CA<0:19>, is an even number or an odd number. When the number of bits having a logic high level in the command address signal set CA<0:19> is an even number, the parity check circuit 221 may determine that the command address signal set CA<0:19> does not include an error. When the number of bits having a logic high level in the command address signal set CA<0:19> is an odd number, the parity check circuit 221 may determine that the command address signal set CA<0:19> includes an error. When the command address signal set CA<0:19> includes an error, the parity check circuit 221 may enable the error detection signal PER. When the command address signal set CA<0:19> does not include an error, the parity check circuit 221 may maintain the state of the error detection signal PER to a disable state. The parity check circuit 221 may include a plurality of parity checkers including a plurality of XOR gates so that an error of the command address signal set CA<0:19> can be detected. The parity check circuit 221 may receive the reference clock signal CKR, and may detect an error of the command address signal set CA<0:19> in synchronization with the reference clock signal CKR. For example, the parity check circuit 221 may generate the error detection signal PER by synchronizing the output signal of the plurality of parity checkers with the reference clock signal CKR.

The error signal generation circuit 222 may receive the error detection signal PER from the parity check circuit 221, and may receive the command detection signal CMD82 from the command decoding circuit 210. The error signal generation circuit 222 may generate the first block signal ERRM and the second block signal ERRP, based on the error detection signal PER and the command detection signal CMD82. When the error detection signal PER is disabled, the error signal generation circuit 222 may maintain both the states of the first and second block signals ERRM and ERRP to the disable state. When the error detection signal PER is enabled and the command detection signal CMD82 is disabled, the error signal generation circuit 222 may enable the first block signal ERRM and disable the second block signal ERRP. When both the error detection signal PER and the command detection signal CMD82 are enabled, the error signal generation circuit 222 may enable both the first and second block signals ERRM and ERRP.

The shifting circuit 230 may receive the command address signal set CA<0:19>, the reference clock signal CKR, and the block signal ERRM and ERRP. The shifting circuit 230 may generate an internal command address signal set CAO<0:19> by shifting the command address signal set CA<0:19>, based on the reference clock signal CKR and the block signal ERRM and ERRP. The shifting circuit 230 may include a plurality of shifters that are sequentially coupled in series. Each of the plurality of shifters may operate in synchronization with the reference clock signal CKR. The plurality of shifters may sequentially store and shift the command address signal set CA<0:19> in synchronization with the reference clock signal CKR. The shifting circuit 230 may reset some or all of the plurality of shifters based on the block signal ERRM and ERRP. The shifting circuit 230 can block the command address signal set CA<0:19> from being output as the internal command address signal set CAO<0:19> by resetting the plurality of shifters based on the block signal ERRM and ERRP.

The number of shifters that are included in the shifting circuit 230 may be determined so that at least a command address signal set that has been currently input and a command address signal set that was input prior to the currently input command address signal set can be stored together based on the first and second latency. When the error detection signal PER is enabled and the command detection signal CMD82 is disabled, the shifting circuit 230 can block the currently input command address signal set and a command address signal set that is input after the currently input command address signal set from being output as the internal command address signal set CAO<0:19>, based on the block signal ERRM and ERRP. When both the error detection signal PER and the command detection signal CMD82 are enabled, the shifting circuit 230 can block all of the currently input command address signal set, the command address signal set that was input after the currently input command address signal set, and the command address signal set that was input prior to the currently input command address signal set from being output as the internal command address signal set CAO<0:19>. The shifting circuit 230 may include n shifters. In this case, n may be determined based on a longer time, among delay times of the command decoding circuit 210 and the error decision circuit 220. For example, the number of shifters that are included in the shifting circuit 230 may be determined based on the first latency, and n may be an integer greater than the first latency. When the first latency is 3, n may be 4. The shifting circuit 230 may include at least four shifters. The shifting circuit 230 may receive the command address signal set CA<0:19>, and may output the internal command address signal set CAO<0:19> after third latency. A time corresponding to the third latency may correspond to four periods of the reference clock signal CKR.

The shifting circuit 230 may reset first to (n−1)-th shifters based on the first block signal ERRM. When the first block signal ERRM is enabled, a command address signal set that has been stored in the first to (n−1)-th shifters might not be output as the internal command address signal set CAO<0:19>. The shifting circuit 230 may reset the n-th shifter based on the second block signal ERRP. When the second block signal ERRP is enabled, a command address signal set that has been stored in the n-th shifter might not be output as the internal command address signal set CAO<0:19>.

Figure 3:
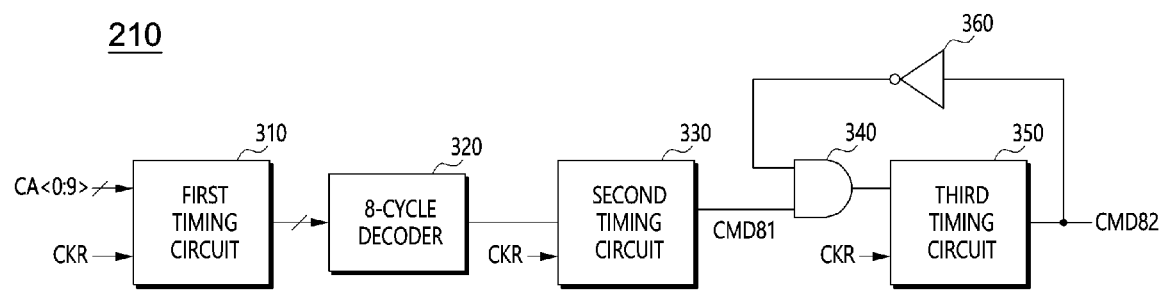
FIG. 3 is a diagram illustrating a configuration of a command decoding circuit illustrated in FIG. 2.

FIG. 3 is a diagram illustrating a construction of the command decoding circuit 210 illustrated in FIG. 2. Referring to FIG. 3, the command decoding circuit 210 may include a first timing circuit 310, an 8-cycle decoder 320, a second timing circuit 330, a logic gate 340, a third timing circuit 350, and an inverter 360. The first timing circuit 310 may receive the ten bit command address signals CA<0:9> of the command address signal set CA<0:19> and the reference clock signal CKR. The first timing circuit 310 may output the command address signals CA<0:9> to the 8-cycle decoder 820 in synchronization with the reference clock signal CKR. For example, the first timing circuit 310 may operate in synchronization with a rising edge of the reference clock signal CKR. The 8-cycle decoder 320 may receive the command address signals CA<0:9> from the first timing circuit 310, and may detect the type of command address signal set CA<0:19> based on the logic levels of at least some of the command address signals CA<0:9>. The 8-cycle decoder 320 may detect whether the command address signal set CA<0:19> is a command address signal set having the first type or a command address signal set of a first phase having the second type, based on the command address signals CA<0:9>. For example, when determining that the command address signal set CA<0:19> is the command address signal set having the first type based on the command address signals CA<0:9>, the 8-cycle decoder 320 may output an output signal having a logic low level. When determining that the command address signal set CA<0:19> is the command address signal set of the first phase having the second type based on the command address signals CA<0:9>, the 8-cycle decoder 320 may output an output signal having a logic high level. The second timing circuit 330 may receive the output signal of the 8-cycle decoder 320 and the reference clock signal CKR. The second timing circuit 330 may output the output signal of the 8-cycle decoder 320 as a preliminary command detection signal CMD81 in synchronization with the reference clock signal CKR. For example, the second timing circuit 330 may operate in synchronization with a rising edge of the reference clock signal CKR. The logic gate 340 may receive the preliminary command detection signal CMD81 and the output signal of the inverter 360. When both the preliminary command detection signal CMD81 and the output signal of the inverter 360 have a logic high level, the logic gate 340 may generate the output signal having a logic high level. When any one of the preliminary command detection signal CMD81 and the output signal of the inverter 360 has a logic low level, the logic gate 340 may generate the output signal having a logic low level. The logic gate 340 may be an AND gate. The third timing circuit 350 may receive the output signal of the logic gate 340 and the reference clock signal CKR. The third timing circuit 350 may output the output signal of the logic gate 340 as the command detection signal CMD82 in synchronization with the reference clock signal CKR. For example, the third timing circuit 350 may operate in synchronization with a rising edge of the reference clock signal CKR. The inverter 360 may receive the command detection signal CMD82, and may invert and drive the command detection signal CMD82. The inverter 360 may provide the output signal of the inverter 360 to the logic gate 340.

When detecting that the command address signal set CA<0:19> is a command address signal set having the first type based on the command address signals CA<0:9>, the 8-cycle decoder 320 may output the output signal having a logic low level, and the preliminary command detection signal CMD81 may also have a logic low level. Accordingly, the state of the command detection signal CMD82 having the logic low level may be maintained to the disable state. When detecting that the command address signal set CA<0:19> is a command address signal set having the second type based on the command address signals CA<0:9>, the 8-cycle decoder 320 may output the output signal having a logic high level, and the logic level of the preliminary command detection signal CMD81 may also shift to a logic high level. The output signal of the inverter 360 may have a logic high level, and the logic level of the output signal of the logic gate 340 may shift to a logic high level based on the preliminary command detection signal CMD81. After a time corresponding to one period of the reference clock signal CKR after the logic level of the preliminary command detection signal CMD81 shifts to the logic high level, the third timing circuit 350 may enable the command detection signal CMD82 to a logic high level. When the command detection signal CMD82 is enabled, the inverter 360 may provide the logic gate 340 with the output signal having a logic low level, and the logic level of the output signal of the logic gate 340 may shift to a logic low level. When the command detection signal CMD82 is enabled and the time corresponding to one period of the reference clock signal CKR elapses, the third timing circuit 350 may disable the command detection signal CMD82. The preliminary command detection signal CMD81 and the command detection signal CMD82 may be enabled during the time corresponding to one period of the reference clock signal CKR. The command decoding circuit 210 may output the preliminary command detection signal CMD81 after a time corresponding to two periods of the reference clock signal CKR elapses through the first timing circuit 310, the second timing circuit 330, and the third timing circuit 350, and may output the command detection signal CMD82 after a time corresponding to three periods of the reference clock signal CKR elapses.

Figure 4:
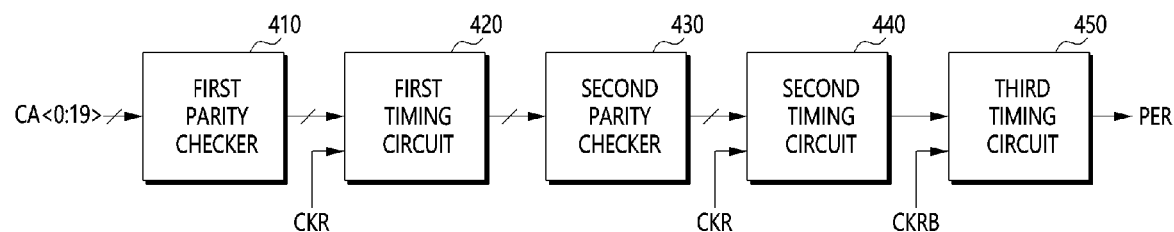
FIG. 4 is a diagram illustrating a configuration of a parity check circuit illustrated in FIG. 2.

FIG. 4 is a diagram illustrating a construction of the parity check circuit 221 illustrated in FIG. 2. Referring to FIG. 4, the parity check circuit 221 may include a first parity checker 410, a first timing circuit 420, a second parity checker 430, a second timing circuit 440, and a third timing circuit 450. The first parity checker 410 may receive the command address signal set CA<0:19>, and may primarily perform an XOR operation on bits that are included in the command address signal set CA<0:19>. The results of the XOR operation of the first parity checker 410 may be provided to the first timing circuit 420. The first timing circuit 420 may receive the results of the XOR operation of the first parity checker 410 and the reference clock signal CKR. The first timing circuit 420 may provide the results of the XOR operation of the first parity checker 410 to the second parity checker 430 in synchronization with the reference clock signal CKR. For example, the first timing circuit 420 may operate in synchronization with a rising edge of the reference clock signal CKR. The second parity checker 430 may secondarily perform an XOR operation on the results of the XOR operation of the first parity checker 410. The results of the XOR operation of the second parity checker 430 may be provided to the second timing circuit 440. The second timing circuit 440 may receive the results of the XOR operation of the second parity checker 430 and the reference clock signal CKR. The second timing circuit 440 may provide the results of the XOR operation of the second parity checker 430 to the third timing circuit 450 in synchronization with the reference clock signal CKR. For example, the second timing circuit 440 may operate in synchronization with a rising edge of the reference clock signal CKR. The third timing circuit 450 may receive the output signal of the second timing circuit 440 and the reference clock signal CKR. The third timing circuit 450 may output the output signal of the second timing circuit 440 as the error detection signal PER in synchronization with the reference clock signal CKR. For example, the third timing circuit 450 may operate in synchronization with a falling edge of the reference clock signal CKR. The third timing circuit 450 may receive a complementary signal CKRB of the reference clock signal, and may operate in synchronization with a rising edge of the complementary signal CKRB of the reference clock signal CKR. The parity check circuit 221 may output the error detection signal PER after a time corresponding to a two and half (2.5) period of the reference clock signal CKR elapses through the first to third timing circuits 420, 440, and 450.

Figure 5:
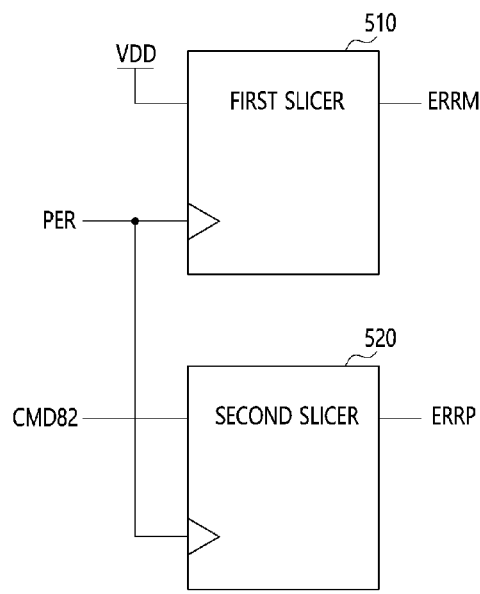
FIG. 5 is a diagram illustrating a configuration of an error signal generation circuit illustrated in FIG. 2.

FIG. 5 is a diagram illustrating a construction of the error signal generation circuit 222 illustrated in FIG. 2. Referring to FIG. 5, the error signal generation circuit 222 may include a first slicer 510 and a second slicer 520. An input terminal of the first slicer 510 may receive a power source voltage VDD, and a clock terminal of the first slicer 510 may receive the error detection signal PER. The first block signal ERRM may be output through an output terminal of the first slicer 510. When the error detection signal PER is enabled to a logic high level, the first slicer 510 may enable the first block signal ERRM to a logic high level by outputting the power source voltage VDD as the first block signal ERRM. An input terminal of the second slicer 520 may receive the command detection signal CMD82. A clock terminal of the second slicer 520 may receive the error detection signal PER. The first block signal ERRP may be output through an output terminal of the second slicer 520. When the error detection signal PER is enabled to a logic high level, the second slicer 520 may output the command detection signal CMD82 as the second block signal ERRP. When the error detection signal PER is enabled to a logic high level after the command detection signal CMD82 is enabled to a logic high level, the second slicer 520 may enable the second block signal ERRP to a logic high level. When the command detection signal CMD82 is disabled to a logic low level, the second slicer 520 may maintain the state of the second block signal ERRP to the disable state.

Figure 6:
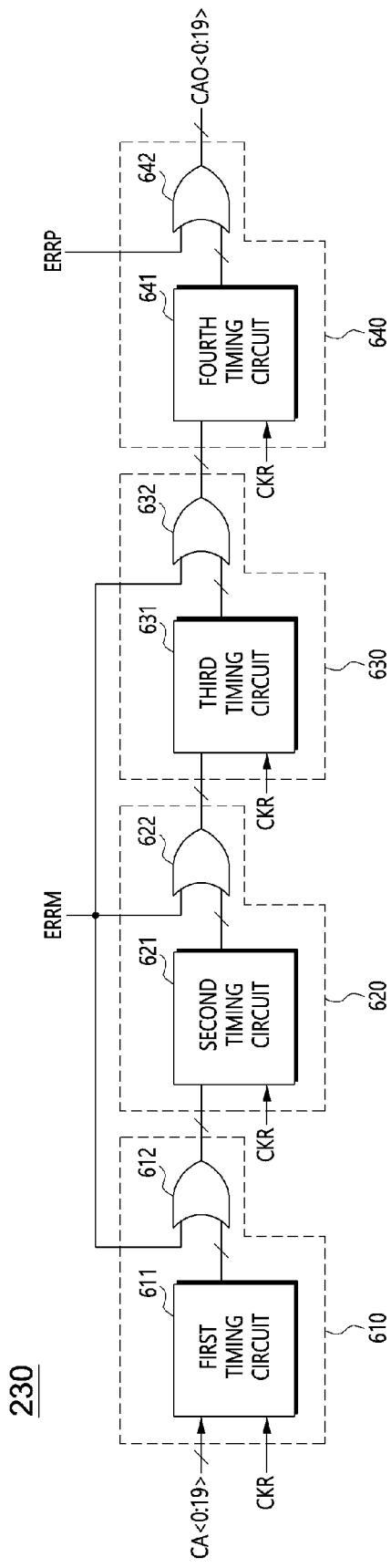
FIG. 6 is a diagram illustrating a configuration of a shifting circuit illustrated in FIG. 2.

FIG. 6 is a diagram illustrating a construction of the shifting circuit 230 illustrated in FIG. 2. Referring to FIG. 6, the shifting circuit 230 may include a first shifter 610, a second shifter 620, a third shifter 630, and a fourth shifter 640. The first shifter 610 may receive the command address signal set CA<0:19>, the reference clock signal CKR, and the first block signal ERRM. The first shifter 610 may store and output the command address signal set CA<0:19> in synchronization with the reference clock signal CKR. The first shifter 610 may reset the output signal of the first shifter 610 based on the first block signal ERRM. The second shifter 620 may receive the output signal of the first shifter 610, the reference clock signal CKR, and the first block signal ERRM. The second shifter 620 may store and output the output signal of the first shifter 610 that has been received in synchronization with the reference clock signal CKR. The second shifter 620 may reset the output signal of the second shifter 620 based on the first block signal ERRM. The third shifter 630 may receive the output signal of the second shifter 620, the reference clock signal CKR, and the first block signal ERRM. The third shifter 630 may store and output the output signal of the second shifter 620 that has been received in synchronization with the reference clock signal CKR. The third shifter 630 may reset the output signal of the third shifter 630 based on the first block signal ERRM. The fourth shifter 640 may receive the output signal of the third shifter 630, the reference clock signal CKR, and the second block signal ERRP. The fourth shifter 640 may store the output signal of the third shifter 630 that has been received in synchronization with the reference clock signal CKR, and may output the output signal of the third shifter 630 as the internal command address signal set CAO<0:19>. The fourth shifter 640 may reset the internal command address signal set CAO<0:19> based on the second block signal ERRP.

The first shifter 610 may include a first timing circuit 611 and a first OR gate 612. The first timing circuit 611 may receive the command address signal set CA<0:19> and the reference clock signal CKR, and may store and output the command address signal set CA<0:19> in synchronization with the reference clock signal CKR. The first OR gate 612 may receive the output signal of the first timing circuit 611 and the first block signal ERRM. When the first block signal ERRM is disabled to a logic low level, the first OR gate 612 may output the output signal of the first timing circuit 611 as the output signal of the first shifter 610. When the first block signal ERRM is enabled to a logic high level, the first OR gate 612 may reset the output signal of the first shifter 610 to a logic high level, regardless of the output signal of the first timing circuit 611. The second shifter 620 may include a second timing circuit 621 and a second OR gate 622. The second timing circuit 621 may receive the output signal of the first OR gate 612 and the reference clock signal CKR, and may store and output the output signal of the first OR gate 612 that has been received in synchronization with the reference clock signal CKR. The second OR gate 622 may receive the output signal of the second timing circuit 621 and the first block signal ERRM. When the first block signal ERRM is disabled to a logic low level, the second OR gate 622 may output the output signal of the second timing circuit 621 as the output signal of the second shifter 620. When the first block signal ERRM is enabled to a logic high level, the second OR gate 622 may reset the output signal of the second shifter 620 to a logic high level, regardless of the output signal of the second timing circuit 621. The third shifter 630 may include a third timing circuit 631 and a third OR gate 632. The third timing circuit 631 may receive the output signal of the second OR gate 622 and the reference clock signal CKR, and may store and output the output signal of the second OR gate 622 that has been received in synchronization with the reference clock signal CKR. The third OR gate 623 may receive the output signal of the third timing circuit 631 and the first block signal ERRM. When the first block signal ERRM is disabled to a logic low level, the third OR gate 632 may output the output signal of the third timing circuit 631 as the output signal of the third shifter 630. When the first block signal ERRM is enabled to a logic high level, the third OR gate 632 may reset the output signal of the third shifter 630 to a logic high level, regardless of the output signal of the third timing circuit 631. The fourth shifter 640 may include a fourth timing circuit 641 and a fourth OR gate 642. The fourth timing circuit 641 may receive the output signal of the third OR gate 632 and the reference clock signal CKR, and may store and output the output signal of the third OR gate 632 that has been received in synchronization with the reference clock signal CKR. The fourth OR gate 642 may receive the output signal of the fourth timing circuit 641 and the second block signal ERRP. When the second block signal ERRP is disabled to a logic low level, the fourth OR gate 642 may output the output signal of the fourth timing circuit 641 as the internal command address signal set CAO<0:19>. When the second block signal ERRP is enabled to a logic high level, the fourth OR gate 642 may reset the internal command address signal set CAO<0:19> to a logic high level, regardless of the output signal of the fourth timing circuit 641.

Figure 7A:
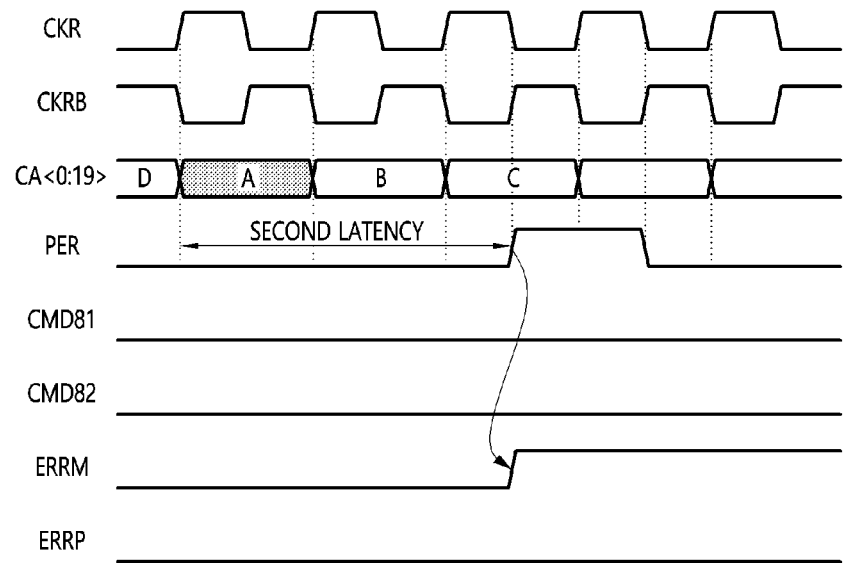
FIGS. 7A, 7B, and 7C are timing diagrams illustrating operations of the command address control circuit according to embodiments.
Figure 7B:
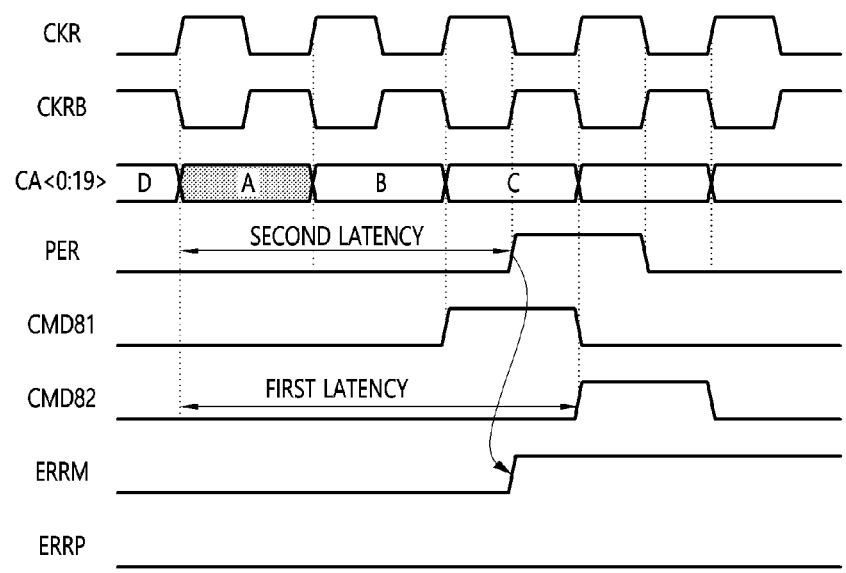
Figure 7C:
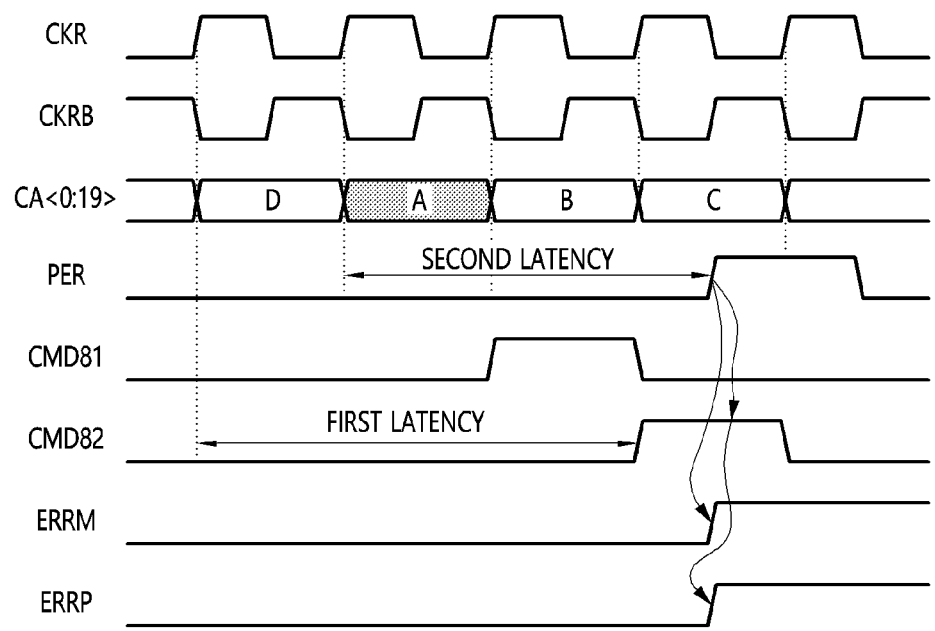

FIGS. 7A, 7B, and 7C are timing diagrams illustrating operations of the command address control circuit 200 according to embodiments. The operation of the command address control circuit 200 according to an embodiment is described as follows with reference to FIGS. 2, 7A, 7B, and 7C. FIG. 7A may illustrate a case in which an error is present in a command address signal set having the first type. The command address control circuit 200 may receive the command address signal set CA<0:19> in synchronization with a rising edge of the reference clock signal CKR. In FIG. 7A, the command address signal set A that is currently received by the command address control circuit 200 is indicated by shading. The parity check circuit 221 may detect whether an error is present in the currently received command address signal set A. When an error is present in the currently received command address signal set A, the parity check circuit 221 may enable the error detection signal PER to a logic high level after the time corresponding to the second latency elapses from timing at which the currently received command address signal set A was received. The command decoding circuit 210 may detect the type of currently received command address signal set A based on some bits of the currently received command address signal set A. When the currently received command address signal set A is a command address signal set having the first type, the command decoding circuit 210 may maintain the states of both the preliminary detection signal CMD81 and the command detection signal CMD82 to the disable state. The error signal generation circuit 222 may enable the first block signal ERRM to a logic high level, in synchronization with a rising edge of the error detection signal PER. Since the logic level of the command detection signal CMD82 is a logic low level at the rising edge of the error detection signal PER, the error signal generation circuit 222 may maintain the state of the second block signal ERRP to the disable state.

After the error detection signal PER is enabled, the currently received command address signal set A may be in the state in which the currently received command address signal set A has been stored in the third shifter 630 of the shifting circuit 230. Command address signal sets B and C that have been sequentially received after the currently received command address signal set A was received may be stored in the second and first shifters 620 and 610 of the shifting circuit 230, respectively. The fourth shifter 640 may be in the state in which a command address signal set D that was received before the currently received command address signal set A is received has been stored in the fourth shifter 640. When the first block signal ERRM is enabled, the first, second, and third shifters 610, 620, and 630 of the shifting circuit 230 may reset the output signals of the first, second, and third shifters 610, 620, and 630. Since the state of the second block signal ERRP is maintained to the disable state, the previously received command address signal set D that has been stored in the fourth shifter 640 may be validly output as the internal command address signal set CAO<0:19>. In contrast, the command address signal set A that has been stored in the third shifter 630 and the command address signal sets B and C that have been received after being stored in the second and first shifters 620 and 610 may be invalidated without being output as the internal command address signal set CAO<0:19>.

FIG. 7B may illustrate a case in which an error is present in a command address signal set of a first phase having the second type. The command address control circuit 200 may receive the command address signal set CA<0:19> in synchronization with a rising edge of the reference clock signal CKR. In FIG. 7B, the command address signal set CA<0:19> A that is currently received by the command address control circuit 200 is indicated by shading. The parity check circuit 221 may detect whether an error is present in the currently received command address signal set A. When an error is present in the currently received command address signal set A, the parity check circuit 221 may enable the error detection signal PER to a logic high level after the time corresponding to the second latency elapses from timing at which the currently received command address signal set A was received. The command decoding circuit 210 may detect the type of currently received command address signal set A based on some bits of the currently received command address signal set A. When the currently received command address signal set A is a command address signal set of a first phase having the second type, the command decoding circuit 210 may enable the preliminary command detection signal CMD81 to a logic high level after a time corresponding to two periods of the reference clock signal CKR from timing at which the some bits of the currently received command address signal set A were received. The command decoding circuit 210 may enable the command detection signal CMD82 after a time corresponding to one period of the reference clock signal CKR from timing at which the preliminary command detection signal CMD81 was enabled (i.e., after the time corresponding to the first latency elapses from timing at which the currently received command address signal set A was received). The error signal generation circuit 222 may enable the first block signal ERRM to a logic high level in synchronization with a rising edge of the error detection signal PER. Since the logic level of the command detection signal CMD82 is a logic low level at the rising edge of the error detection signal PER, the error signal generation circuit 222 may maintain the state of the second block signal ERRP to the disable state.

After the time corresponding to the first latency elapses, the currently received command address signal set A may be in the state in which the currently received command address signal set A has been stored in the third shifter 630 of the shifting circuit 230. Command address signal sets B and C that have been received after the currently received command address signal set A was received may be stored in the second and first shifters 620 and 610 of the shifting circuit 230, respectively. The fourth shifter 640 of the shifting circuit 230 may be in the state in which a command address signal set D that was received before the currently received command address signal set A is received has been stored in the fourth shifter 640. When the first block signal ERRM is enabled, the first, second, and third shifters 610, 620, and 630 of the shifting circuit 230 may reset the output signals of the first, second, and third shifters 610, 620, and 630. Since the second block signal ERRP maintains the disable state, the previously received command address signal set D that has been stored in the fourth shifter 640 may be validly output as the internal command address signal set CAO<0:19>. In contrast, the command address signal set A that has been stored in the third shifter 630 and the command address signal sets B and C that have been received after being stored in the second and first shifters 620 and 610 may be invalidated without being output as the internal command address signal set CAO<0:19>.

FIG. 7C may illustrate a case in which an error is present in a command address signal set of a second phase having the second type. The command address control circuit 200 may receive the command address signal set CA<0:19> in synchronization with a rising edge of the reference clock signal CKR. In FIG. 7C, the command address signal set CA<0:19> A that is currently received by the command address control circuit 200 is indicated by shading. The parity check circuit 221 may detect whether an error is present in the currently received command address signal set A. When an error is present in the currently received command address signal set A, the parity check circuit 221 may enable the error detection signal PER to a logic high level after a time corresponding to the second latency elapses from timing at which the currently received command address signal set A was received. The command decoding circuit 210 may detect the type of currently received command address signal set A based on some bits of the currently received command address signal set A. When the currently received command address signal set A is a command address signal set of a second phase having the second type, the command decoding circuit 210 might not enable the preliminary command detection signal CMD81. However, since a command address signal set D that was received before the currently received command address signal set A is received is a command address signal set of a first phase having the second type, the command decoding circuit 210 may enable the preliminary command detection signal CMD81 to a logic high level after a time corresponding to two periods of the reference clock signal CKR from timing at which the previously received command address signal set D was received. The command decoding circuit 210 may enable the command detection signal CMD82 after a time corresponding to one period of the reference clock signal CKR from timing at which the preliminary command detection signal CMD81 is enabled (i.e., after the time corresponding to the first latency elapses from the timing at which the previously received command address signal set D was received). The error signal generation circuit 222 may enable the first block signal ERRM to a logic high level in synchronization with a rising edge of the error detection signal PER. Since the logic level of the command detection signal CMD82 is a logic high level at the rising edge of the error detection signal PER, the error signal generation circuit 222 may also enable the second block signal ERRP to a logic high level.

After the time corresponding to the first latency elapses, the currently received command address signal set A may be in the state in which the currently received command address signal set A has been stored in the third shifter 630 of the shifting circuit 230. Command address signal sets B and C that have been received after the currently received command address signal set A was received may be stored in the second and first shifters 620 and 610 of the shifting circuit 230, respectively. The fourth shifter 640 may be in the state in which the previously received command address signal set D has been stored in the fourth shifter 640 of the shifting circuit 230. When the first block signal ERRM is enabled, the first, second, and third shifters 610, 620, and 630 of the shifting circuit 230 may reset the output signals of the first, second, and third shifters 610, 620, and 630. When the second block signal ERRP is enabled, the fourth shifter 640 may reset the internal command address signal set CAO<0:19>. Accordingly, the command address control circuit 200 can block not only the currently received command address signal set of the second phase having the second type A, but the previously received command address signal set of the first phase having the second type D from being output as the internal command address signal set CAO<0:19>.

Figure 8B:
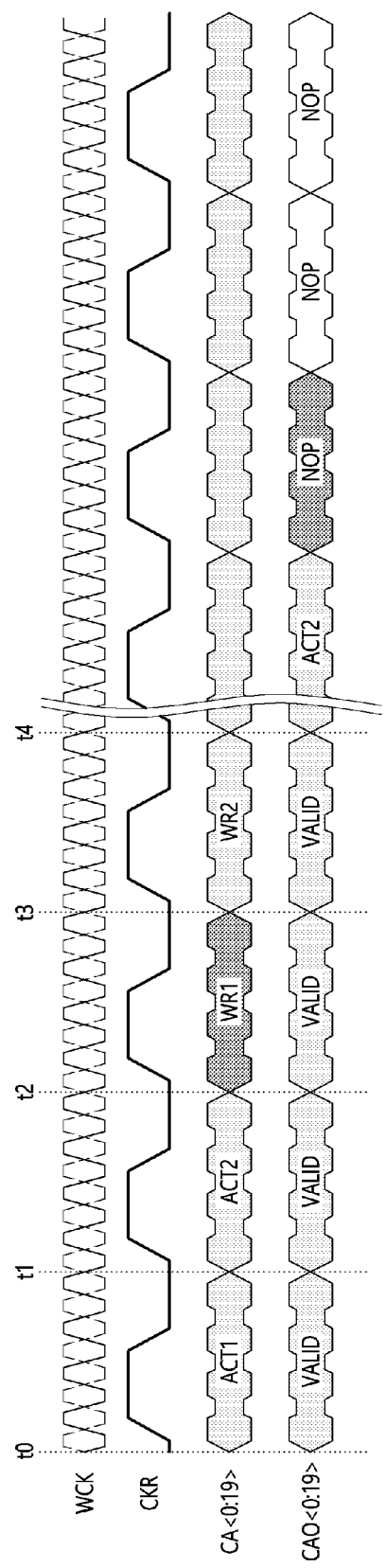
Figure 8C:
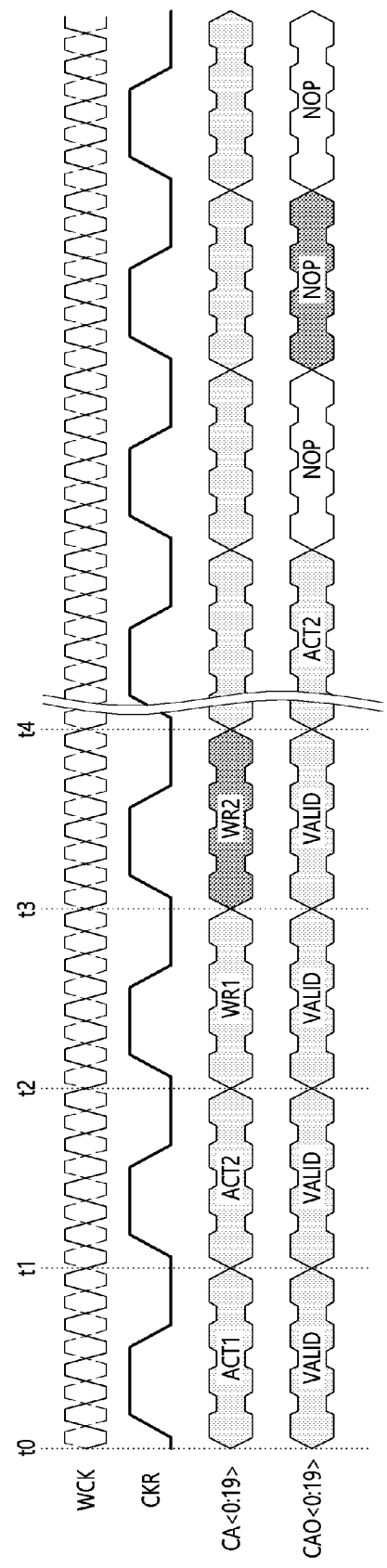

FIGS. 8A, 8B, and 8C are timing diagrams illustrating operations of the semiconductor system according to various embodiments. The operations of the semiconductor system 100 according to various embodiments are described as follows with reference to FIGS. 1, 8A, 8B, and 8C. FIG. 8A may illustrate a case in which an error is present in a command address signal set having the first type. The first semiconductor device 110 may transmit the command address signal set CA<0:19> to the second semiconductor device 120 for each unit cycle of the clock signal WCK. The first semiconductor device 110 may transmit active command signals ACT1 and ACT2, that is, a command address signal set having the second type, in an interval between timing t0 and timing t2. The first semiconductor device 110 may transmit the command address signal set ACT1 of a first phase, among the active command signals ACT1 and ACT2, in an interval between the timing t0 and timing t1, and may transmit the command address signal set ACT2 of a second phase, among the active command signals ACT1 and ACT2, in an interval between the timing t1 and the timing t2. The first semiconductor device 110 may transmit a precharge command signal PRE, that is, a command address signal set having the first type, in an interval between the timing t2 and timing t3. The second semiconductor device 120 may output the internal command address signal set CAO<0:19> from the command address signal set CA<0:19> in synchronization with the reference clock signal CKR. The frequency of the reference clock signal CKR may be ¼ of the frequency of the clock signal WCK. The second semiconductor device 120 may receive the command address signal set CA<0:19>, and may output the command address signal set CA<0:19> as the internal command address signal set CAO<0:19> in synchronization with a rising edge of the reference clock signal CKR after the third latency. When an error is present in the precharge command signal PRE, the second semiconductor device 120 may enable the first block signal ERRM by detecting the error. The second semiconductor device 120 may output, as a valid internal command address signal set VALID ACT1, the command address signal set CA<0:19> that has been previously received prior to the timing t1 and the command address signal set ACT1 of a first phase, among the active command signals ACT1 and ACT2. The second semiconductor device 120 may output the command address signal set ACT2 of a second phase, among the active command signals ACT1 and ACT2 that have been received in the interval between the timing t1 and the timing t2, as a valid internal command address signal set ACT2. The second semiconductor device 120 can block the precharge command signal PRE that has been received in the interval between the timing t2 and the timing t3 from being output as the internal command address signal set CAO<0:19> based on the first block signal ERRM (NOP). The second semiconductor device 120 might not output, as the internal command address signal set CAO<0:19>, another command address signal set CA<0:19> that has been received from the first semiconductor device 110 after the timing t3 (NOP). Moreover, the second semiconductor device 120 may generate the error signal ERR at timing at which the presence of an error in the precharge command signal PRE is detected, and may transmit the error signal ERR to the first semiconductor device 110. In an embodiment, the second semiconductor device 120 may generate the error signal ERR when a random latency is elapsed after the presence of the error in the precharge command signal PRE is detected. For example, the second semiconductor device 120 may generate the error signal ERR when the random latency is elapsed after the first block signal ERRM (NOP) is enabled. When receiving the error signal ERR, the first semiconductor device 110 might not transmit the command address signal set to the second semiconductor device 120.

FIG. 8B may illustrate a case in which an error is present in a command address signal set of a first phase having the second type. The first semiconductor device 110 may transmit the command address signal set CA<0:19> to the second semiconductor device 120 for each unit cycle of the clock signal WCK. The first semiconductor device 110 may transmit active command signals ACT1 and ACT2, that is, a command address signal set having the second type, in an interval between timing t0 and timing t2. The first semiconductor device 110 may transmit the command address signal set ACT1 of a first phase, among the active command signals ACT1 and ACT2, in the interval between the timing t0 and timing t1, and may transmit the command address signal set ACT2 of a second phase, among the active command signals ACT1 and ACT2, in an interval between the timing t1 and the timing t2. The first semiconductor device 110 may transmit write command signals WR1 and WR2, that is, another command address signal set having the second type, in an interval between the timing t2 and timing t4. The first semiconductor device 110 may transmit the command address signal set WR1 of a first phase, among the write command signals WR1 and WR2, in an interval between the timing t2 and timing t3, and may transmit a command address signal set WR2 of a second phase, among the write command signals WR1 and WR2, in an interval between the timing t3 and the timing t4. The second semiconductor device 120 may output the internal command address signal set CAO<0:19> from the command address signal set CA<0:19> in synchronization with the reference clock signal CKR. The second semiconductor device 120 may receive the command address signal set CA<0:19>, and may output the command address signal set CA<0:19> as the internal command address signal set CAO<0:19> in synchronization with a rising edge of the reference clock signal CKR after the third latency. When an error is present in the command address signal set WR1 of the first phase, among the write command signals WR1 and WR2, the second semiconductor device 120 may enable the first block signal ERRM by detecting the error. The second semiconductor device 120 may output, as a valid internal command address signal set VALID ACT2, the command address signal set CA<0:19> and the active command signals ACT1 and ACT2 that have been received prior to the timing t2. The second semiconductor device 120 can block the command address signal set WR1 of the first phase, among the write command signals WR1 and WR2 that have been received in the interval between the timing t2 and the timing t3, from being output as the internal command address signal set CAO<0:19> based on the first block signal ERRM (NOP). The second semiconductor device 120 might not output, as the internal command address signal set CAO<0:19>, the command address signal set WR2 of the second phase, among the write command signals WR1 and WR2, and another command address signal set CA<0:19>, which have been received from the first semiconductor device 110 after the timing t3 (NOP). Moreover, the second semiconductor device 120 may generate the error signal ERR at timing at which the presence of an error in the command address signal set WR1 of the first phase, among the write command signals WR1 and WR2, is detected, and may transmit the error signal ERR to the first semiconductor device 110. In an embodiment, the second semiconductor device 120 may generate the error signal ERR when the random latency is elapsed after the presence of the error in the command address signal set WR1 of the first phase is detected. When receiving the error signal ERR, the first semiconductor device 110 might not transmit the command address signal set CA<0:19> to the second semiconductor device 120.

FIG. 8C may illustrate a case in which an error is present in a command address signal set of a second phase having the second type. The first semiconductor device 110 may transmit the command address signal set CA<0:19> to the second semiconductor device 120 for each unit cycle of the clock signal WCK. The first semiconductor device 110 may transmit active command signals ACT1 and ACT2, that is, a command address signal set having the second type, in an interval between timing t0 and timing t2. The first semiconductor device 110 may transmit the command address signal set ACT1 of a first phase, among the active command signals ACT1 and ACT2, in an interval between the timing t0 and the timing t1, and may transmit the command address signal set ACT2 of a second phase, among the active command signals ACT1 and ACT2, in an interval between the timing t1 and timing t2. The first semiconductor device 110 may transmit the write command signals WR1 and WR2, that is, another command address signal set having the second type, in an interval between the timing t2 and timing t4. The first semiconductor device 110 may transmit the command address signal set WR1 of a first phase, among the write command signals WR1 and WR2, in an interval between the timing t2 and timing t3, and may transmit the command address signal set WR2 of a second phase, among the write command signals WR1 and WR2, in an interval between the timing t3 and the timing t4. The second semiconductor device 120 may output the internal command address signal set CAO<0:19> from the command address signal set CA<0:19> in synchronization with the reference clock signal CKR. The second semiconductor device 120 may output the command address signal set CA<0:19> as the internal command address signal set CAO<0:19> in synchronization with a rising edge of the reference clock signal CKR after the third latency after receiving the command address signal set CA<0:19>. When an error is present in the command address signal set WR2 of the second phase, among the write command signals WR1 and WR2, the second semiconductor device 120 may enable the first block signal ERRM and the second block signal ERRP by detecting the error. The second semiconductor device 120 may output, as a valid internal command address signal set VALID ACT2, the command address signal set CA<0:19> and the active command signals ACT1 and ACT2 that have been received prior to the timing t2. The second semiconductor device 120 can block the command address signal set WR2 of the second phase, among the write command signals WR1 and WR2 that have been received in the interval between the timing t3 and the timing t4, from being output as the internal command address signal set CAO<0:19> based on the first block signal ERRM, and may also block the command address signal set WR1 of the first phase, among the write command signals WR1 and WR2 that have been received in the interval between the timing t2 and the timing t3, from being output as the internal command address signal set CAO<0:19> based on the second block signal ERRP (NOP). The second semiconductor device 120 might not output, as the internal command address signal set CAO<0:19>, another command address signal set CA<0:19> that has been received from the first semiconductor device 110 after the timing t4 (NOP). Moreover, the second semiconductor device 120 may generate the error signal ERR at timing at which the presence of an error in the command address signal set WR2 of the second phase, among the write command signals WR1 and WR2, is detected, and may transmit the error signal ERR to the first semiconductor device 110. In an embodiment, the second semiconductor device 120 may generate the error signal ERR when the random latency is elapsed after the presence of the error in the command address signal set WR2 of the second phase is detected. When receiving the error signal ERR, the first semiconductor device 110 might not transmit the command address signal set CA<0:19> to the second semiconductor device 120.

Figure 9:
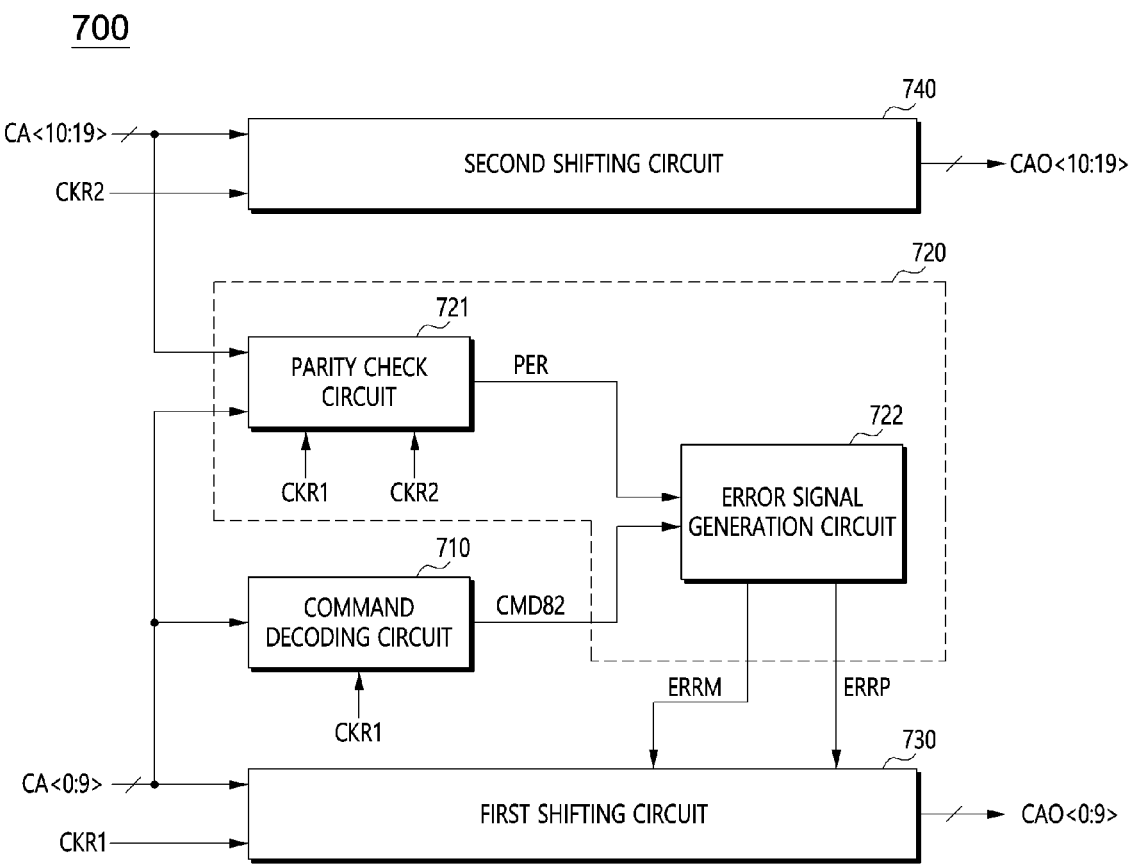
FIG. 9 is a diagram illustrating a configuration of a command address control circuit according to an embodiment.

FIG. 9 is a diagram illustrating a construction of a command address control circuit 700 according to an embodiment. The command address control circuit 700 may be applied as the command address control circuit 123 illustrated in FIG. 1. Referring to FIG. 9, the command address control circuit 700 may include a command decoding circuit 710, an error decision circuit 720, a first shifting circuit 730, and a second shifting circuit 740. The command decoding circuit 710 may receive some bits of a command address signal set CA<0:19>. The command decoding circuit 710 may receive first to tenth bit command address signals CA<0:9>, among the twenty bit command address signals CA<0:19> of the command address signal set CA<0:19>. The command decoding circuit 710 may detect the type of command address signal set CA<0:19> based on the command address signals CA<0:9>.

The command decoding circuit 710 may detect whether the command address signal set CA<0:19> is a command address signal set having the first type or a command address signal set having the second type. When the command address signal set CA<0:19> is a command address signal set having the second type, the command decoding circuit 710 may detect whether the command address signal set CA<0:19> is a command address signal set of a first phase or a command address signal set of a second phase. The command decoding circuit 710 may generate a command detection signal CMD82 based on the results of the detection of the type of command address signal set CA<0:19>. The command decoding circuit 710 may enable the command detection signal CMD82 when the command address signal set CA<0:19> is a command address signal set of a first phase having the second type. The command decoding circuit 710 might not enable the command detection signal CMD82 when the command address signal set CA<0:19> is a command address signal set having the first type.

The command decoding circuit 710 may further receive a first reference clock signal CKR1. The first reference clock signal CKR1 may be generated based on the clock signal WCK in FIG. 1. For example, the first reference clock signal CKR1 may be generated by dividing the frequency of the clock signal WCK. The pulse width of the first reference clock signal CKR1 may be longer than the pulse width of the clock signal WCK. Although being not limited, the first reference clock signal CKR1 may be generated by dividing the frequency of the clock signal WCK by 4. The command decoding circuit 710 may detect the type of command address signal set CA<0:19> in synchronization with the first reference clock signal CKR1. The command decoding circuit 710 may output the command detection signal CMD82 after first latency in synchronization with the first reference clock signal CKR1. The first latency may be a time corresponding to three periods of the reference clock signal CKR1. The command decoding circuit 710 may have substantially the same structure as the command decoding circuit 210 illustrated in FIG. 3.

The error decision circuit 720 may receive the command address signal set CA<0:19>. The error decision circuit 720 may detect whether an error is present in the command address signal set CA<0:19>, based on a parity bit that is included in the command address signal set CA<0:19>. The error decision circuit 720 may generate an error detection signal PER by detecting whether an error is present in the command address signal set CA<0:19>. When an error is not present in the command address signal set CA<0:19>, the error decision circuit 720 may maintain the state of the error detection signal PER to a disable state. When an error is present in the command address signal set CA<0:19>, the error decision circuit 720 may enable the error detection signal PER.

The error decision circuit 720 may receive the command detection signal CMD82 from the command decoding circuit 710. The error decision circuit 720 may generate a block signal ERRM and ERRP based on the error detection signal PER and the command detection signal CMD82. The block signal ERRM and ERRP may include a plurality of block signals. When both the error detection signal PER and the command detection signal CMD82 are in the disable state, the error decision circuit 720 may maintain the state of the block signal ERRM and ERRP to the disable state. When the error detection signal PER is enabled and the command detection signal CMD82 maintains the disable state, the error decision circuit 720 may enable at least some of the plurality of block signals of the block signal ERRM and ERRP. When the error detection signal PER is enabled after the command detection signal CMD82 is enabled, the error decision circuit 720 may enable all of the plurality of block signals of the block signal ERRM and ERRP.

The block signal ERRM and ERRP may include a first block signal ERRM and a second block signal ERRP. When the error detection signal PER is enabled and the command detection signal CMD82 is in the disable state, the error decision circuit 720 may enable the first block signal ERRM and maintain the state of the second block signal ERRP to the disable state. In other words, when an error is present in the command address signal set having the first type or the command address signal set of the first phase having the second type, the error decision circuit 720 may enable the first block signal ERRM and maintain the state of the second block signal ERRP to the disable state. When the error detection signal PER is enabled after the command detection signal CMD82 is enabled, the error decision circuit 720 may enable both the first block signal ERRM and the second block signal ERRP. In other words, when an error is present in the command address signal set of the second phase having the second type, the error decision circuit 720 may enable the first block signal ERRM and the second block signal ERRM.

The error decision circuit 720 may further receive the first reference clock signal CKR1 and a second reference clock signal CKR2. The second reference clock signal CKR2 may be a complementary signal of the first reference clock signal CKR1. The error decision circuit 720 may generate the error detection signal PER and the block signal ERRM and ERRP in synchronization with the first and second reference clock signals CKR1 and CKR2. The error decision circuit 720 may generate the block signal ERRM and ERRP after second latency. A time corresponding to the second latency may be longer than the time corresponding to the first latency. For example, the second latency may be a time corresponding to a three and half (3.5) period of the first reference clock signal CKR1.

The error decision circuit 720 may include a parity check circuit 721 and an error signal generation circuit 722. The parity check circuit 721 may receive the command address signal set CA<0:19>, and may generate the error detection signal PER by detecting whether an error is present in the command address signal set CA<0:19>. The parity check circuit 721 may detect whether an error is present in the command address signal set CA<0:19>, based on the logic levels of 19 bit command address signals and one bit parity that are included in the command address signal set CA<0:19>. When an error is present in the command address signal set CA<0:19>, the parity check circuit 721 may enable the error detection signal PER. When an error is not present in the command address signal set CA<0:19>, the parity check circuit 721 may maintain the state of the error detection signal PER to the disable state. The parity check circuit 721 may receive the first and second reference clock signals CKR1 and CKR2. The parity check circuit 721 may detect an error of the command address signal set CA<0:19> in synchronization with the first reference clock signal CKR1, and may output the error detection signal PER in synchronization with the second reference clock signal CKR2.

The error signal generation circuit 722 may receive the error detection signal PER from the parity check circuit 721, and may receive the command detection signal CMD82 from the command decoding circuit 710. The error signal generation circuit 722 may generate the first block signal ERRM and the second block signal ERRP, based on the error detection signal PER and the command detection signal CMD82. When the error detection signal PER is disabled, the error signal generation circuit 722 may maintain the states of both the first and second block signals ERRM and ERRP to the disable state. When the error detection signal PER is enabled and the command detection signal CMD82 is disabled, the error signal generation circuit 722 may enable the first block signal ERRM and disable the second block signal ERRP. When both the error detection signal PER and the command detection signal CMD82 are enabled, the error signal generation circuit 722 may enable both the first and second block signals ERRM and ERRP. The error signal generation circuit 722 may have substantially the same structure as the error signal generation circuit 222 illustrated in FIG. 5.

The first shifting circuit 730 may receive some command address signals CA<0:9> of the command address signal set, the first reference clock signal CKR1, and the block signal ERRM and ERRP. The first shifting circuit 730 may generate some internal command address signals CAO<0:9> of an internal command address signal set by shifting the some command address signals CA<0:9> of the command address signal set based on the first reference clock signal CKR1 and the block signal ERRM and ERRP. The first shifting circuit 730 may include a plurality of shifters that are sequentially coupled in series. Each of the plurality of shifters may operate in synchronization with the first reference clock signal CKR1. The plurality of shifters may sequentially output the some command address signals CA<0:9> of the command address signal set in synchronization with the first reference clock signal CKR1. The first shifting circuit 730 may reset some or all of the plurality of shifters based on the block signal ERRM and ERRP. The first shifting circuit 730 can block the some command address signals CA<0:9> of the command address signal set from being output as the some internal command address signals CAO<0:9> of the internal command address signal set by resetting the plurality of shifters based on the block signal ERRP and ERRM.

The first shifting circuit 730 may include n shifters. In this case, n may be determined based on latency of the error decision circuit 720. For example, n may be an integer greater than the second latency. When the second latency is 3.5, n may be 4. The first shifting circuit 730 may include at least four shifters. The shifting circuit 730 may receive the some command address signals CA<0:9> of the command address signal set, and may output the some internal command address signals CAO<0:9> of the internal command address signal set after third latency. A time corresponding to the third latency may correspond to four periods of the first reference clock signal CKR1.

The first shifting circuit 730 may reset first to (n−1)-th shifters based on the first block signal ERRM. When the first block signal ERRM is enabled, some command address signals of the command address signal set that have been stored in the first to (n−1)-th shifters might not be output as the some internal command address signals CAO<0:9> of the internal command address signal set. The first shifting circuit 730 may reset the n-th shifter based on the second block signal ERRP. When the second block signal ERRP is enabled, some command address signals of the command address signal set that have been stored in the n-th shifter might not be output as the some internal command address signals CAO<0:9> of the internal command address signal set. The first shifting circuit 730 may have substantially the same structure as the first shifting circuit 230 illustrated in FIG. 6 except that the first shifting circuit 730 receives the some command address signals CA<0:9> of the command address signal set.

The second shifting circuit 740 may receive the remaining some command address signals CA<10:19> of the command address signal set and the second reference clock signal CKR2. The second shifting circuit 740 may generate the remaining some internal command address signals CAO<10:19> of the internal command address signal set by shifting the remaining some command address signals CA<10:19> of the command address signal set based on the second reference clock signal CKR2. The second shifting circuit 740 may include a plurality of shifters that are sequentially coupled in series. Each of the plurality of shifters may operate in synchronization with the second reference clock signal CKR2. The plurality of shifters may sequentially output the remaining some command address signals CA<10:19> of the command address signal set in synchronization with the first reference clock signal CKR1. The second shifting circuit 740 may include the same number of shifters as the number of shifters that are included in the first shifting circuit 730. The second shifting circuit 740 may receive the remaining some command address signals CA<10:19> of the command address signal set, and may output the remaining some internal command address signals CAO<10:19> of the internal command address signal set after the third latency.

Figure 10:
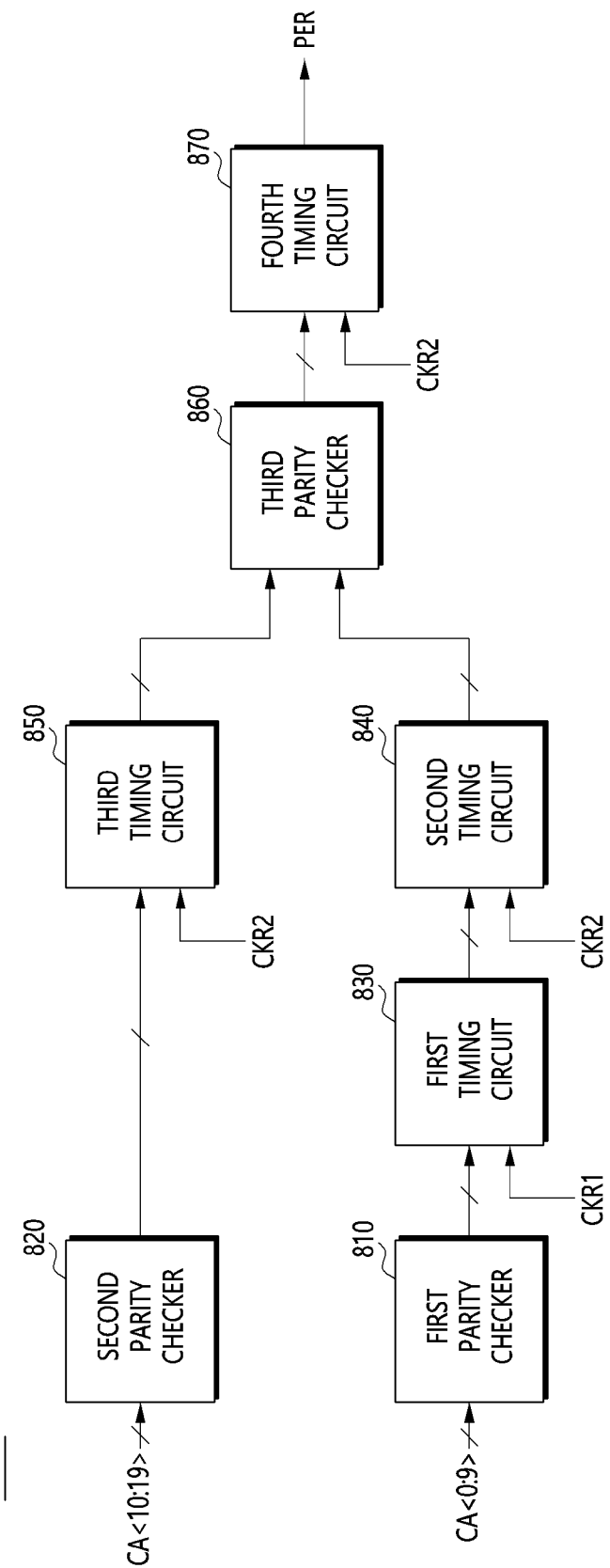
FIG. 10 is a diagram illustrating a configuration of the parity check circuit illustrated in FIG. 9.

FIG. 10 is a diagram illustrating a construction of the parity check circuit 721 illustrated in FIG. 9. The parity check circuit 721 may include a first parity checker 810, a second parity checker 820, a first timing circuit 830, a second timing circuit 840, a third timing circuit 850, a third parity checker 860, and a fourth timing circuit 870. The first parity checker 810 may receive the some command address signals CA<0:9> of the command address signal set, and may primarily perform an XOR operation on bits that are included in the some command address signals CA<0:9> of the command address signal set. The results of the XOR operation of the first parity checker 810 may be provided to the first timing circuit 830. The second parity checker 820 may receive the remaining some command address signals CA<10:19> of the command address signal set, and may primarily perform an XOR operation on bits that are included in the remaining some command address signals CA<10:19> of the command address signal set. The results of the XOR operation of the second parity checker 820 may be provided to the third timing circuit 850. The first timing circuit 830 may receive the results of the XOR operation of the first parity checker 810 and the first reference clock signal CKR1. The first timing circuit 830 may output the results of the XOR operation of the first parity checker 810 as the output signal of the first timing circuit 830 in synchronization with the first reference clock signal CKR1. The first timing circuit 830 may operate in synchronization with a rising edge of the first reference clock signal CKR1. The second timing circuit 840 may receive the output signal of the first timing circuit 830 and the second reference clock signal CKR2. The second timing circuit 840 may output the output signal of the first timing circuit 830 as the output signal of the second timing circuit 840 in synchronization with the second reference clock signal CKR2. The second timing circuit 840 may operate in synchronization with a rising edge of the second reference clock signal CKR2. The third timing circuit 850 may receive the results of the XOR operation of the second parity checker 820 and the second reference clock signal CKR2. The third timing circuit 850 may output the results of the XOR operation of the second parity checker 820 as the output signal of the third timing circuit 850 in synchronization with the second reference clock signal CKR2. The third timing circuit 850 may operate in synchronization with a rising edge of the second reference clock signal CKR2. The third parity checker 860 may receive the output signals of the second and third timing circuits 840 and 850. The output signal of the second timing circuit 840 may be the results of the XOR operation of the first parity checker 810, which have been synchronized with the second reference clock signal CKR2. The output signal of the third timing circuit 850 may be the results of the XOR operation of the second parity checker 820, which have been synchronized with the second reference clock signal CKR2. The third parity checker 860 may secondarily perform an XOR operation on the results of the XOR operations of the first and second parity checkers 810 and 820, which have been synchronized with the second reference clock signal CKR2. The results of the XOR operation of the third parity checker 860 may be provided to the fourth timing circuit 870. The fourth timing circuit 870 may receive the results of the XOR operation of the third parity checker 860 and the second reference clock signal CKR2. The fourth timing circuit 870 may output the results of the XOR operation of the third parity checker 860 as the error detection signal PER in synchronization with the second reference clock signal CKR2. The fourth timing circuit 870 may operate in synchronization with a rising edge of the second reference clock signal CKR2. The parity check circuit 721 may generate the error detection signal PER, after the some command address signals CA<0:9> of the command address signal set are received and a time corresponding to a two and half (2.5) period of the first reference clock signal CKR1 elapses.

Figure 11:
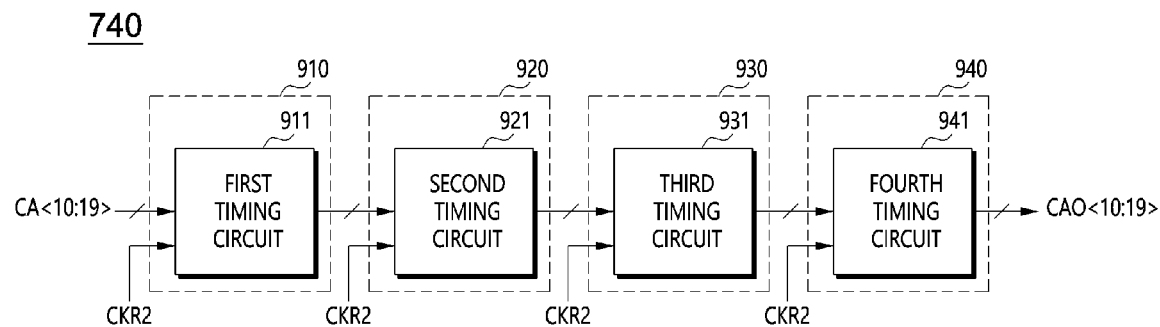
FIG. 11 is a diagram illustrating a configuration of a second shifting circuit illustrated in FIG. 9.

FIG. 11 is a diagram illustrating a construction of the second shifting circuit 740 illustrated in FIG. 9. Referring to FIG. 11, the second shifting circuit 740 may include a first shifter 910, a second shifter 920, a third shifter 930, and a fourth shifter 940. The first shifter 910 may include a first timing circuit 911. The first timing circuit 911 may receive the remaining some command address signals CA<10:19> of the command address signal set and the second reference clock signal CKR2. The first timing circuit 911 may store the remaining some command address signals CA<10:19> of the command address signal set in synchronization with the second reference clock signal CKR2, and may output the stored remaining some command address signals CA<10:19> of the command address signal set as the output signal of the first shifter 911. The first timing circuit 911 may operate in synchronization with a rising edge of the second reference clock signal CKR2. The second shifter 920 may include a second timing circuit 921. The second timing circuit 921 may receive the output signal of the first shifter 910 and the second reference clock signal CKR2. The second timing circuit 921 may store the output signal of the first shifter 910 in synchronization with the second reference clock signal CKR2, and may output the stored output signal of the first shifter 610 as the output signal of the second shifter 920. The second timing circuit 921 may operate in synchronization with a rising edge of the second reference clock signal CKR2. The third shifter 930 may include a third timing circuit 931. The third timing circuit 931 may receive the output signal of the second shifter 920 and the second reference clock signal CKR2. The third timing circuit 931 may output the output signal of the second shifter 920 as the output signal of the third shifter 930 in synchronization with the second reference clock signal CKR2. The third timing circuit 931 may operate in synchronization with a rising edge of the second reference clock signal CKR2. The fourth shifter 940 may include a fourth timing circuit 941. The fourth timing circuit 941 may receive the output signal of the third shifter 930 and the second reference clock signal CKR2. The fourth timing circuit 941 may output the output signal of the third shifter 930 as the output signal of the fourth shifter 940 in synchronization with the second reference clock signal CKR2. The output signal of the fourth timing circuit 940 may be provided as the remaining some internal command address signals CAO<10:19> of the internal command address signal set. The second timing circuit 941 may operate in synchronization with a rising edge of the second reference clock signal CKR2.

Figure 12A:
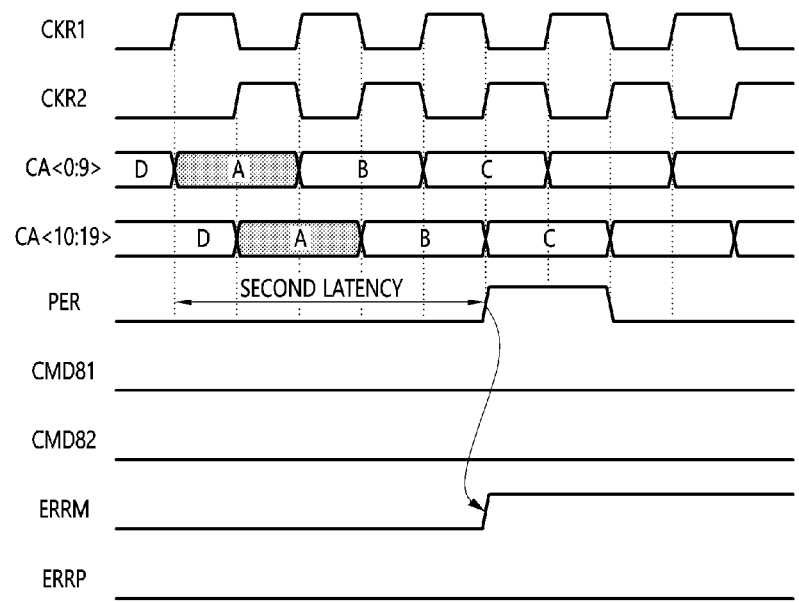
FIGS. 12A, 12B, and 12C are timing diagrams illustrating operations of the command address control circuit according to an embodiment.
Figure 12B:
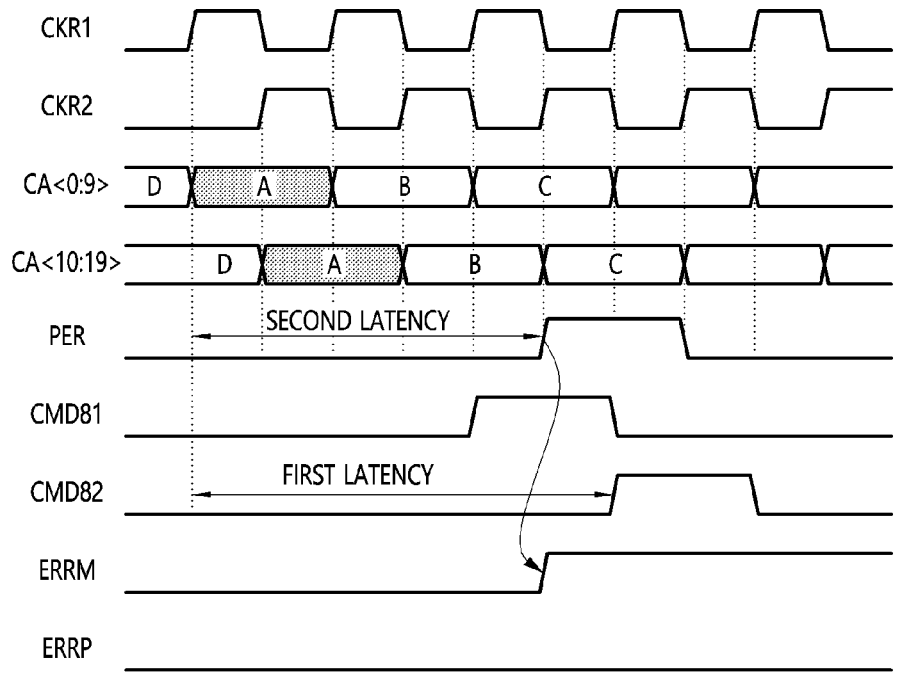
Figure 12C:
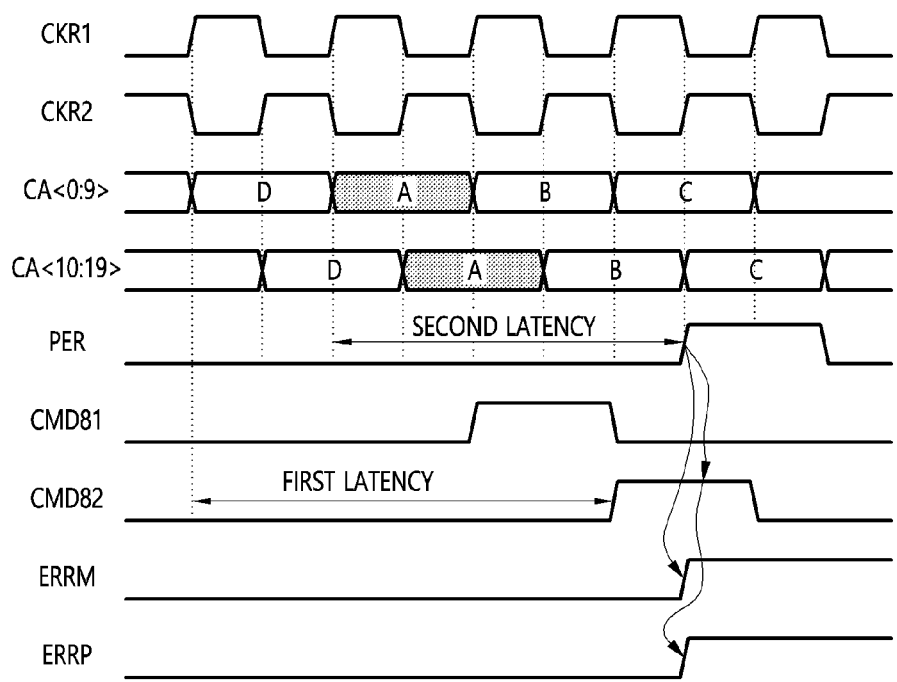

FIGS. 12A, 12B, and 12C are timing diagrams illustrating operations of the command address control circuit 700 according to an embodiment. The operations of the command address control circuit 700 according to embodiments are described as follows with reference to FIGS. 9, 12A, 12B, and 12C. FIG. 12A may illustrate a case in which an error is present in a command address signal set having the first type. The command address control circuit 700 may receive the some command address signals CA<0:9> of the command address signal set in synchronization with a rising edge of the first reference clock signal CKR1, and may receive the remaining some command address signals CA<10:19> of the command address signal set in synchronization with a rising edge of the second reference clock signal CKR2. In FIG. 12A, a command address signal set A that is currently received by the command address control circuit 700 is indicated by shading. The parity check circuit 721 may detect whether an error is present in the currently received command address signal set A. When an error is present in the currently received command address signal set A, the parity check circuit 721 may enable the error detection signal PER to a logic high level after the time corresponding to the second latency elapses from timing at which the some command address signals CA<0:9> of the currently received command address signal set A were received. The command decoding circuit 710 may detect the type of currently received command address signal set A based on the some command address signals CA<0:9> of the currently received command address signal set A. When the currently received command address signal set A is a command address signal set having the first type, the command decoding circuit 710 may maintain the states of both a preliminary detection signal CMD81 and the command detection signal CMD82 to the disable state. The error signal generation circuit 722 may enable the first block signal ERRM to a logic high level in synchronization with a rising edge of the error detection signal PER. Since the logic level of the command detection signal CMD82 is a logic low level at the rising edge of the error detection signal PER, the error signal generation circuit 722 may maintain the state of the second block signal ERRP to the disable state.

After the error detection signal PER is enabled, the some command address signals CA<0:9> of the currently received command address signal set A may be in the state in which the some command address signals have been stored in the third shifter, among the four shifters that are included in the first shifting circuit 730. Some command address signals of command address signal sets B and C that have been sequentially received after the some command address signals CA<0:9> of the currently received command address signal set A were received may be stored in the second and first shifters of the first shifting circuit 730, respectively. The fourth shifter of the first shifting circuit 730 may be in the state in which some command address signals of a command address signal set D that were received before the some command address signals CA<0:9> of the currently received command address signal set A are received have been stored in the fourth shifter. When the first block signal ERRM is enabled, the first to third shifters of the first shifting circuit 730 may reset the output signals of the first to third shifters. Since the second block signal ERRP maintains the disable state, the some command address signals of the command address signal set D, which were previously received and have been stored in the fourth shifter, may be validly output as the some internal command address signals CAO<0:9> of the internal command address signal set. In contrast, all of the some command address signals CA<0:9> of the command address signal set A that have been stored in the third shifter and the some command address signals of the command address signal sets B and C that have been received after being stored in the second and first shifters might not be output as the some internal command address signals CAO<0:9> of the internal command address signal set.

After the some command address signals of the currently received command address signal set A are received and the time corresponding to the third latency elapses, a signal that has been reset to a logic high level may be output as the some internal command address signals CAO<0:9> of the internal command address signal set by the first shifting circuit 730. After the remaining some command address signals of the currently received command address signal set A are received and the time corresponding to the third latency elapses, the remaining some command address signals of the currently received command address signal set A and the remaining some command address signals of the command address signal sets B and C that have been subsequently received may be sequentially output as the remaining some internal command address signals CAO<10:19> of the internal command address signal set by the second shifting circuit 740. However, since the some internal command address signals CAO<0:9> of the internal command address signal set have been reset to a logic high level, the internal command address signal set CAO<0:19> may 22 may be invalidated.

FIG. 12B may illustrate a case in which an error is present in a command address signal set of a first phase having the second type. The command address control circuit 700 may receive the some command address signals CA<0:9> of the command address signal set in synchronization with a rising edge of the first reference clock signal CKR1, and may receive the remaining some command address signals CA<10:19> of the command address signal set in synchronization with a rising edge of the second reference clock signal CKR2. In FIG. 12B, the command address signal set CA<0:19> A that is currently received by the command address control circuit 700 is indicated by shading. The parity check circuit 721 may detect whether an error is present in the currently received command address signal set A. When an error is present in the currently received command address signal set A, the parity check circuit 721 may enable the error detection signal PER to a logic high level from timing at which the some command address signals CA<0:9> of the currently received command address signal set A were received after the time corresponding to the second latency elapses. The command decoding circuit 710 may detect the type of currently received command address signal set A based on the some command address signals CA<0:9> of the currently received command address signal set A. When the currently received command address signal set A is a command address signal set of a first phase having the second type, the command decoding circuit 710 may enable the preliminary command detection signal CMD81 to a logic high level from timing at which the some command address signals CA<0:9> of the currently received command address signal set A were received after a time corresponding to two periods of the reference clock signal CKR. The command decoding circuit 710 may enable the command detection signal CMD82 after a time corresponding to one period of the first reference clock signal CKR1 from timing at which the preliminary command detection signal CMD81 is enabled (i.e., after the time corresponding to the first latency elapses from timing at which the some command address signals CA<0:9> of the currently received command address signal set A were received). The error signal generation circuit 722 may enable the first block signal ERRM to a logic high level in synchronization with a rising edge of the error detection signal PER. Since the logic level of the command detection signal CMD82 is a logic low level at the rising edge of the error detection signal PER, the error signal generation circuit 222 may maintain the state of the second block signal ERRP to the disable state.

After the time corresponding to the second latency elapses, the some command address signals CA<0:9> of the currently received command address signal set A may be in the state in which the some command address signals CA<0:9> have been stored in the third shifter, among the four shifters that are included in the first shifting circuit 730. Some command address signals of command address signal sets B and C that have been received after the some command address signals CA<0:9> of the currently received command address signal set A were received may be stored in the second and first shifters of the first shifting circuit 730, respectively. The fourth shifter of the first shifting circuit 730 may be in the state in which some command address signals of a command address signal set D that were received before the some command address signals CA<0:9> of the currently received command address signal set A are received have been stored in the fourth shifter. When the first block signal ERRM is enabled, the first to third shifters of the first shifting circuit 730 may reset the output signals of the first to third shifters. Since the second block signal ERRP maintains the disable state, the some command address signals of the previously received command address signal set D that have been stored in the fourth shifter may be validly output as the some internal command address signals CAO<0:9> of the internal command address signal set. In contrast, the some command address signals CA<0:9> of the command address signal set A that have been stored in the third shifter and the some command address signals of the command address signal sets B and C that have been received after being stored in the second and first shifters might not be output as the some internal command address signals CAO<0:9> of the internal command address signal set.

After the some command address signals of the currently received command address signal set A are received and the time corresponding to the third latency elapses, a signal that has been reset to a logic high level may be output as the some internal command address signals CAO<0:9> of the internal command address signal set by the first shifting circuit 730. After the remaining some command address signals of the currently received command address signal set A are received and the time corresponding to the third latency elapses, the remaining some command address signals of the currently received command address signal set A and the remaining some command address signals of the command address signal sets B and C that have been subsequently received may be sequentially output as the remaining some internal command address signals CAO<10:19> of the internal command address signal set by the second shifting circuit 740. However, since the some internal command address signals CAO<0:9> of the internal command address signal set have been reset to a logic high level, the internal command address signal set CAO<0:19> may 22 may be invalidated.

FIG. 12C may illustrate a case in which an error is present in a command address signal set of a second phase having the second type. The command address control circuit 700 may receive the some command address signals CA<0:9> of the command address signal set in synchronization with a rising edge of the first reference clock signal CKR1, and may receive the remaining some command address signals CA<10:19> of the command address signal set in synchronization with a rising edge of the second reference clock signal CKR2. In FIG. 12C, a command address signal set CA<0:19> A that is currently received by the command address control circuit 700 is indicated by shading. The parity check circuit 721 may detect whether an error is present in the currently received command address signal set A. When an error is present in the currently received command address signal set A, the parity check circuit 721 may enable the error detection signal PER to a logic high level after the time corresponding to the second latency elapses from timing at which the some command address signals CA<0:9> of the currently received command address signal set A were received. The command decoding circuit 710 may detect the type of currently received command address signal set A based on the some command address signals CA<0:9> of the currently received command address signal set A. When the currently received command address signal set A is a command address signal set of a second phase having the second type, the command decoding circuit 710 might not enable the preliminary command detection signal CMD81. However, since a command address signal set D that was received before the currently received command address signal set A is received is a command address signal set of a first phase having the second type, the command decoding circuit 710 may enable the preliminary command detection signal CMD81 to a logic high level after a time corresponding to two periods of the first reference clock signal CKR1 from timing at which the previously received command address signal set D was received. The command decoding circuit 710 may enable the command detection signal CMD82 after a time corresponding to one period of the first reference clock signal CKR1 from timing at which the preliminary command detection signal CMD81 is enabled (i.e., after the time corresponding to the first latency elapses from timing at which some command address signals of the previously received command address signal set D were received). The error signal generation circuit 722 may enable the first block signal ERRM to a logic high level in synchronization with a rising edge of the error detection signal PER. Since the logic level of the command detection signal CMD82 is a logic high level at the rising edge of the error detection signal PER, the error signal generation circuit 722 may also enable the second block signal ERRP to a logic high level.

After the time corresponding to the second latency elapses, the some command address signals CA<0:9> of the currently received command address signal set A may be in the state in which the some command address signals CA<0:9> have been stored in the third shifter of the first shifting circuit 730. Some command address signals of command address signal sets B and C that have been received after the some command address signals CA<0:9> of the currently received command address signal set A were received may be stored in the second and first shifters of the first shifting circuit 730, respectively. The fourth shifter may be in the state in which some command address signals of the previously received command address signal set D have been stored. When the first block signal ERRM is enabled, the first to third shifters of the first shifting circuit 730 may reset the output signals of the first to third shifters. When the second block signal ERRP is enabled, the fourth shifter may reset some internal command address signals CAO<0:9> of the internal command address signal set. Accordingly, the command address control circuit 700 can block not only some command address signals of the currently received command address signal set of the second phase having the second type A, but some command address signals of the previously received command address signal set of the first phase having the second type D from being output as the some internal command address signals CAO<0:9> of the internal command address signal set.

After the some command address signals of the previously received command address signal set D are received and the time corresponding to the third latency elapses, a signal that has been reset to a logic high level by the first shifting circuit 730 may be output as the some internal command address signals CAO<0:9> of the internal command address signal set. After the remaining some command address signals of the previously received command address signal set D are received and the time corresponding to the third latency elapses, the remaining some command address signals of the command address signal set D that have been previously received from the second shifting circuit 740, the remaining some command address signals of the currently received command address signal set A, and the remaining some command address signal of the command address signal sets B and C that have been subsequently received may be sequentially output as the remaining some internal command address signals CAO<10:19> of the internal command address signal set. However, since the some internal command address signals CAO<0:9> of the internal command address signal set have been reset to a logic high level, the internal command address signal set CAO<0:19> may 22 may be invalidated.

Figure 13:
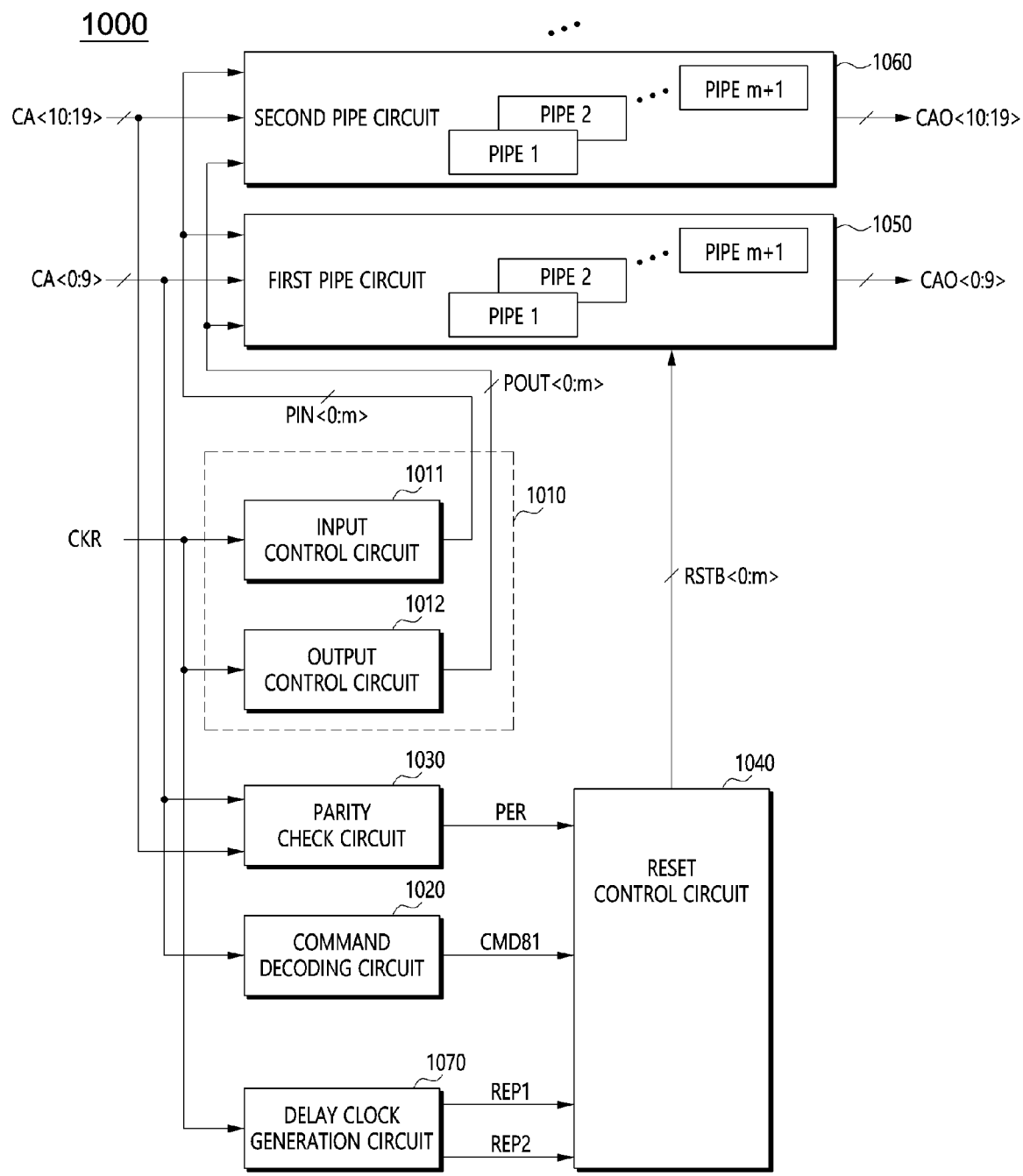
FIG. 13 is a diagram illustrating a configuration of the command address control circuit according to an embodiment.

FIG. 13 is a diagram illustrating a construction of a command address control circuit 1000 according to an embodiment. The command address control circuit 1000 may be applied as the command address control circuit 123 illustrated in FIG. 1. Referring to FIG. 13, the command address control circuit 1000 may include a pipe control circuit 1010, a command decoding circuit 1020, a parity check circuit 1030, a reset control circuit 1040, and a first pipe circuit 1050. The pipe control circuit 1010 may receive a reference clock signal CKR, and may generate input control signals PIN<0:m> and output control signals POUT<0:m> based on the reference clock signal CKR. The input control signals PIN<0:m> may be plural. The number of input control signals PIN<0:m> may correspond to the number of pipes that are included in the first pipe circuit 1050. The output control signals POUT<0:m> may be plural. The number of output control signal POUY<0:m> may correspond to the number of pipes that are included in the first pipe circuit 1050. The pipe control circuit 1010 may provide the reference clock signal CKR as the input control signals PIN<0:m>. The pipe control circuit 1010 may provide the reference clock signal CKR to the first pipe circuit 1040 without delaying the reference clock signal CKR. The pipe control circuit 1010 may delay the reference clock signal CKR and provide the delayed reference clock signal as the output control signals POUT<0:m>.

The pipe control circuit 1010 may include an input control circuit 1011 and an output control circuit 1012. The input control circuit 1011 may generate the input control signals PIN<0:m> by receiving the reference clock signal CKR. The input control circuit 1011 may provide the reference clock signal CKR as the input control signals PIN<0:m> without delaying the reference clock signal CKR. The input control circuit 1011 may sequentially generate the input control signals PIN<0:m> whenever the reference clock signal CKR is toggled. For example, when the reference clock signal CKR is toggled for the first time, the input control circuit 1011 may generate the input control signal PIN<0> in synchronization with a rising edge of the reference clock signal CKR. When the reference clock signal CKR is toggled for the second time, the input control circuit 1011 may generate the input control signal PIN<1> in synchronization with a rising edge of the reference clock signal CKR. When the reference clock signal is toggled for the (m+1)-th time, the input control circuit 1011 may generate the input control signal PIN<m> in synchronization with a rising edge of the reference clock signal CKR. When the reference clock signal CKR is toggled for the (m+2)-th time, the input control circuit 1011 may generate the input control signal PIN<0> again in synchronization with a rising edge of the reference clock signal CKR. The output control circuit 1012 may generate the output control signals POUT<0:m> by receiving the reference clock signal CKR. The output control circuit 1012 may delay the reference clock signal CKR and provide the delayed reference clock signal as the output control signals POUT<0:m>. The output control circuit 1012 may sequentially generate the output control signals POUT<0:m> whenever the reference clock signal CKR is toggled. For example, when the delayed reference clock signal is toggled for the first time, the output control circuit 1012 may generate the output control signal POUT<0> in synchronization with a rising edge of the delayed reference clock signal. When the delayed reference clock signal is toggled for the second time, the output control circuit 1012 may generate the output control signal POUT<1> in synchronization with a rising edge of the delayed reference clock signal. When the delayed reference clock signal is toggled for the (m+1)-th time, the output control circuit 1012 may generate the output control signal POUT<m> in synchronization with a rising edge of the delayed reference clock signal. When the delayed reference clock signal is toggled for the (m+2)-th time, the output control circuit 1012 may generate the output control signal POUT<0> again in synchronization with a rising edge of the delayed reference clock signal. A delay time of the output control circuit 1012 may correspond to latency of the command address control circuit 1000. The latency of the command address control circuit 1000 may be a variable value. Although being not limited, for example, minimum latency of the command address control circuit 1000 may be equal to or less than three periods of the reference clock signal CKR. The output control circuit 1012 may generate the output control signals POUT<0:m> by delaying the reference clock signal CKR for a time longer than the minimum latency.

The command decoding circuit 1020 may receive some command address signals of a command address signal set CA<0:19>. For example, the command decoding circuit 1020 may receive first to tenth bit command address signals CA<0:9> of the command address signal set CA<0:19>. The command decoding circuit 1020 may detect whether the command address signal set CA<0:19> is a command address signal set having the first type or a command address signal set having the second type, based on some command address signals of the command address signal set CA<0:19>. When the command address signal set CA<0:19> is the command address signal set having the second type, the command decoding circuit 1020 may detect whether the command address signal set CA<0:19> is a command address signal set of a first phase or a command address signal set of a second phase. The command decoding circuit 1020 may generate a command detection signal CMD81 based on the results of the detection of the type of command address signal set CA<0:19>. The command decoding circuit 1020 may maintain the state of the command detection signal CMD81 to the disable state, when the command address signal set CA<0:19> is the command address signal set having the first type and the command address signal set CA<0:19> is the command address signal set of the second phase having the second type. When the command address signal set CA<0:19> is the command address signal set of the first phase having the second type, the command decoding circuit 1020 may enable the command detection signal CMD81. The command decoding circuit 1020 may perform substantially the same function as the 8-cycle decoder 320 illustrated in FIG. 3. The command decoding circuit 1020 might not operate in synchronization with the reference clock signal CKR, unlike the command decoding circuit 210 illustrated in FIGS. 2 and 3. The command decoding circuit 1020 may asynchronously generate the command detection signal CMD81 by detecting a command type. The time that is taken for the command decoding circuit 1020 to receive some command address signals of the command address signal set CA<0:19> and to generate the command detection signal CMD81 may be enough if within the minimum latency.

The parity check circuit 1030 may receive the command address signal set CA<0:19>, and may generate an error detection signal PER by detecting whether an error is present in the command address signal set CA<0:19>. The parity check circuit 1030 may detect whether an error is present in the command address signal set CA<0:19>, based on the logic levels of 19 bit command address signals and one bit parity that are included in the command address signal set CA<0:19>. The parity check circuit 1030 may enable the error detection signal PER when an error is present in the command address signal set CA<0:19>. The parity check circuit 1030 may 1030 may maintain the state of the error detection signal PER to the disable state when an error is not present in the command address signal set CA<0:19>. The parity check circuit 1030 may perform substantially the same function as the parity check circuit 221 illustrated in FIG. 2. However, unlike the parity check circuit 221, the parity check circuit 1030 might not operate in synchronization with the reference clock signal CKR. The parity check circuit 1030 may asynchronously perform an error detection operation. The time that is taken for the parity check circuit 1030 to receive the command address signal set CA<0:19> and to generate the error detection signal PER may be enough if within the minimum latency.

The reset control circuit 1040 may receive the command detection signal CMD81 and the error detection signal PER, and may generate reset signals RSTB<0:m>, based on the reference clock signal CKR, the command detection signal CMD81, and the error detection signal PER. The reset signals RSTB<0:m> may be plural. The number of reset signals RSTB<0:m> may correspond to the number of pipes that are included in the first pipe circuit 1050. The reset control circuit 1040 may receive a first delay clock signal REP1 and a second delay clock signal REP2, and may generate the reset signals RSTB<0:m> from the command detection signal CMD81 and the error detection signal PER in synchronization with the first and second delay clock signals REP1 and REP2.

The command address control circuit 1000 may further include a delay clock generation circuit 1070. The delay clock generation circuit 1070 may receive the reference clock signal CKR, and may generate the first and second delay clock signals REP1 and REP2 based on the reference clock signal CKR. The delay clock generation circuit 1070 may generate the first delay clock signal REP1 by delaying the reference clock signal CKR by a first time, and may generate the second delay clock signal REP2 by delaying the reference clock signal CKR by a second time. The first time may correspond to a time from timing at which the parity check circuit 1030 receives the command address signal set CA<0:19> to timing at which the parity check circuit 1030 generates the error detection signal PER. The delay clock generation circuit 1070 may include a first modeling circuit that copies the delay time of the parity check circuit 1030, and may generate the first delay clock signal REP1 by delaying the reference clock signal CKR through the first modeling circuit. The second time may correspond to a time from timing at which the command decoding circuit 1020 receives some command address signals of the command address signal set CA<0:19> to timing at which the command decoding circuit 1020 generates the command detection signal CMD81. The delay clock generation circuit 1070 may include a second modeling circuit that copies the delay time of the command decoding circuit 1020, and may generate the second delay clock signal REP2 by delaying the reference clock signal CKR through the second modeling circuit.

The first pipe circuit 1050 may receive some command address signals of the command address signal set CA<0:19>, the input control signals PIN<0:m>, the output control signals POUT<0:m>, and the reset signals RSTB<0:m>. For example, the first pipe circuit 1050 may receive the first to tenth bit command address signals CA<0:9> of the command address signal set CA<0:19>. The first pipe circuit 1050 may store the command address signals CA<0:9> based on the input control signals PIN<0:m>. The first pipe circuit 1050 may 1050 may include a plurality of pipes. The first pipe circuit 1050 may store the command address signals CA<0:9> in different pipes whenever the input control signals PIN<0:m> are enabled. For example, if the first pipe circuit 1050 includes (m+1) (m is an arbitrary integer equal to or greater than 2) pipes, the command address signals CA<0:9> that are received for the first time may be stored in a first pipe based on the input control signal PIN<0>, the command address signals CA<0:9> that are received for the second time may be stored in a second pipe based on the input control signal PIN<1, and the command address signals CA<0:9> that are received for the (m+1)-th time may be stored in an (m+1)-th pipe based on the input control signal PIN<m>.

The first pipe circuit 1050 may output command address signals that have been stored in the first pipe circuit 1050 as some internal command address signals of an internal command address signal set CAO<0:19> based on the output control signals POUT<0:m>. For example, the first pipe circuit 1050 may output first to tenth bit internal command address signals CAO<0:9> of the internal command address signal set CAO<0:19>. The first pipe circuit 1050 may output command address signals that have been stored in different pipes as the internal command address signals CAO<0:9> whenever the output control signals POUT<0:m> are enabled. The first pipe may output the command address signals CA<0:9> that have been stored in the first pipe, as the internal command address signals CAO<0:9>, based on the output control signal POUT<0>. The second pipe may output command address signals CA<0:19> that have been stored in the second pipe, as the internal command address signals CAO<0:9>, based on the output control signal POUT<1>. The (m+1)-th pipe may output the command address signals CA<0:19> that have been stored in the (m+1)-th pipe, as the internal command address signals CAO<0:9>, based on the output control signal POUT<m>.

The first pipe circuit 1050 may invalidate a command address signal that has been stored in the first pipe circuit 1050, based on the reset signals RSTB<0:m>. The first pipe circuit 1050 may reset the internal command address signals CAO<0:9> by resetting the logic level of the command address signal that has been stored in the first pipe 1050, based on the reset signals RSTB<0:m>. For example, the first to (m+1)-th pipes may receive the reset signals RSTB<0:m>, respectively. The first pipe may reset the command address signals CA<0:9> that have been stored in the first pipe, based on the reset signal RSTB<0>. The second pipe may reset the command address signals CA<0:9> that have been stored in the second pipe, based on the reset signal RSTB<1>. The (m+1)-th pipe may reset the command address signals CA<0:9> that have been stored in the (m+1)-th pipe, based on the reset signal RSTB<m>. The command address signals CA<0:9> that have been reset based on the reset signals RSTB<0:m> might not be output as the internal command address signals CAO<0:9>.

When an error is present in some command address signals of the command address signal set CA<0:19> that have been received for the k-th time (k is an arbitrary integer between 1 and m) and the command address signal set CA<0:19> that has been received for the k-th time is a command address signal set having the first type or a command address signal set of a first phase having the second type, the reset control circuit 1040 may enable a reset signal RSTB<k−1> that is provided to a pipe in which the command address signals CA<0:9> that have been received for the k-th time are stored, and may enable all of reset signals RSTB<k:m> that are provided to pipes in which the command address signals CA<0:9> that have been received from a (k+1)-th time to the (m+1)-th time are stored. Based on the reset signals RSTB<0:m>, the first pipe circuit 1050 may reset the command address signals that have been stored in the k-th to (m+1)-th pipes, and may block the command address signals that have been stored in the k-th to (m+1)-th pipes from being output as the internal command address signals CAO<0:9>. When an error is present in some command address signals of the command address signal set CA<0:19> that has been received for the j-th time (j is an arbitrary integer between 2 and m) and the command address signal set CA<0:19> that has been received for the j-th time is a command address signal set of a second phase having the second type, the reset control circuit 1040 may enable a reset signal RSTB<j−1> that is provided to a pipe in which the command address signals CA<0:9> that have been received for the j-th time are stored, and may enable reset signals RSTB<j:m> that are provided to a pipe in which the command address signals CA<0:9> that have been received from a (j+1)-th time to the (m+1)-th time are stored. Furthermore, the reset control circuit 1040 may also enable a reset signal RSTB<j–2> that is provided to a pipe in which the command address signals CA<0:9> that have been received for the (j–1)-th time are stored. Based on the reset signals RSTB<0:m>, the first pipe circuit 1050 may reset the command address signals that have been stored in the (j–1)-th to (m+1)-th pipes, and may block the command address signals that have been stored in the (j–1)-th to (m+1)-th pipes from being output as the internal command address signals CAO<0:9>.

The command address control circuit 1000 may further include a second pipe circuit 1060. The second pipe circuit 1060 may receive the remaining some command address signals of the command address signal set CA<0:19>, the input control signals PIN<0:m>, and the output control signals POUT<0:m>. The second pipe circuit 1060 may store the remaining some command address signals of the command address signal set CA<0:19> based on the input control signals PIN<0:m>. For example, the second pipe circuit 1060 may 1060 may receive eleventh to twentieth bit command address signals CA<10:19> of the command address signal set CA<0:19>, and may store the command address signals CA<10:19>. The second pipe circuit 1060 may include a plurality of pipes. The number of pipes that are included in the second pipe circuit 1060 may be substantially the same as the number of pipes that are included in the first pipe circuit 1050. The second pipe circuit 1060 may store the command address signals CA<10:19> in different pipes whenever the input control signals PIN<0:m> are enabled. For example, if the second pipe circuit 1060 includes m pipes (m is an arbitrary integer equal to or greater than 3), the command address signals CA<10:19> that have been received for the first time may be stored in a first pipe based on the input control signal PIN<0>, the command address signals CA<10:19> that have been received for the second time may be stored in a second pipe based on the input control signal PIN<1>, and the command address signals CA<10:19> that have been received for the (m+1)-th time may be stored in an (m+1)-th pipe based on the input control signal PIN<m>.

The second pipe circuit 1060 may output the remaining some command address signals of the stored command address signal set CA<0:19> to the second pipe circuit 1060 as the remaining some internal command address signals of the internal command address signal set CAO<0:19> based on the output control signals POUT<0:m>. The second pipe circuit 1060 may output eleventh to twentieth bit internal command address signals CA<10:19> of the internal command address signal set CAO<0:19>. The second pipe circuit 1060 may 1060 may output command address signals that have been stored in different pipes as the internal command address signals CAO<0:9>, respectively, whenever the output control signals POUT<0:m> are enabled. The first pipe may output the command address signals CA<10:19> that have been stored in the first pipe, as the internal command address signals CAO<10:19>, based on the output control signal POUT<0>. The second pipe may output the command address signals CA<10:19> that have been stored in the second pipe, as the internal command address signals CAO<10:19>, based on the output control signal POUT<1>. The (m+1)-th pipe may output the command address signals CA<10:19> that have been stored in the (m+1)-th pipe, as the internal command address signals CAO<10:19>, based on the output control signal POUT<m>.

Figure 14:
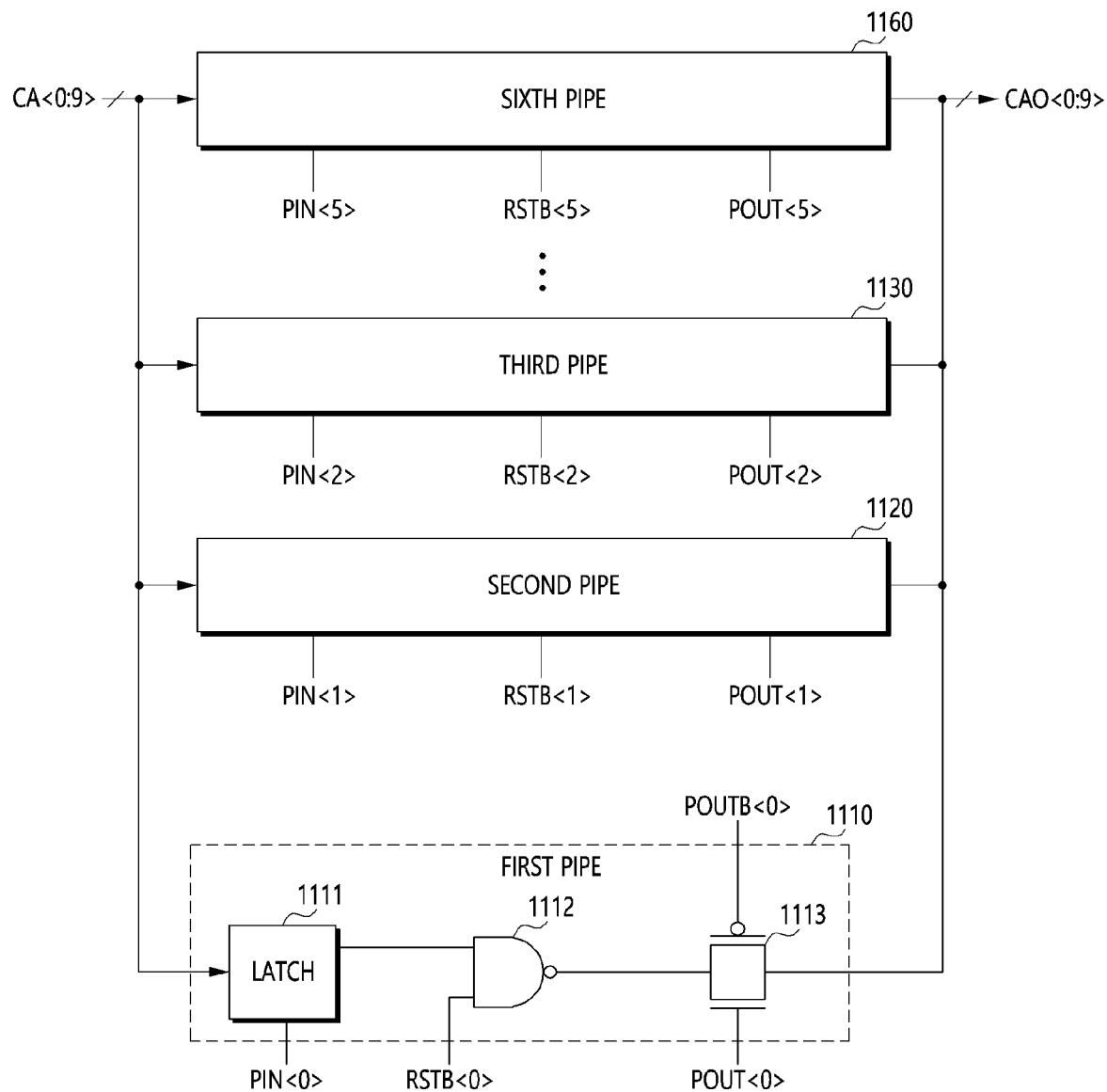
FIG. 14 is a diagram illustrating a configuration of a first pipe circuit illustrated in FIG. 13.

FIG. 14 is a diagram illustrating a construction of the first pipe circuit 1050 illustrated in FIG. 13. Referring to FIG. 14, the first pipe circuit 1050 may include a first pipe 1110 to a sixth pipe 1160. In FIG. 14, the number of pipes that are included in the first pipe circuit 1050 has been exemplified as being 6, but the number of pipes is intended to be not limited. The number of pipes that are included in the first pipe circuit 1050 may be variously changed. The first pipe 1110 may receive some command address signals of the command address signal set CA<0:19>, the input control signal PIN<0>, the output control signal POUT<0>, and the reset signal RSTB<0>. The first pipe 1110 may store the command address signals CA<0:9> when the input control signal PIN<0> is enabled. The first pipe 1110 may 1110 may output the stored command address signals CA<0:9> as the internal command address signal set CAO<0:9> when the output control signal POUT<0> is enabled. The first pipe 1110 may block the stored command address signals CA<0:9> from being output based on the reset signal RSTB<0>. When the reset signal RSTB<0> is in a disable state, the first pipe 1110 may output the stored command address signals CA<0:9> as the internal command address signal set CAO<0:19>. When the reset signal RSTB<0> is enabled, the first pipe 1110 may reset the stored command address signals CA<0:9>, and can invalidate the internal command address signals CAO<0:9> by preventing the stored command address signals CA<0:9> from being provided as the internal command address signals CAO<0:9>. For example, the logic levels of the internal command address signals CAO<0:9> may be fixed to a specific logic level.

The first pipe 1110 may include a latch 1111, a NAND gate 1112, and a pass gate 1113. An input terminal of the latch 1111 may receive the command address signals CA<0:9>. A clock terminal of the latch 1111 may receive the input control signal PIN<0>. When the input control signal PIN<0> is enabled, the latch 1111 may store the command address signals CA<0:9>. The stored command address signals may be output through an output terminal of the latch 1111. The NAND gate 1112 may receive the output signal of the latch 1111 and the reset signal RSTB<0>. When the reset signal RSTB having a logic high level is in the disable state, the NAND gate 1112 may output, as the output signal of the NAND gate 1112, some command address signals of a command address signal set that have been stored in the latch 1111. When the reset signal RSTB<0> having a logic low level is enabled, the NAND gate 1112 may fix the output signal of the NAND gate 1112 to a logic high level. The pass gate 1113 may receive the output control signal POUT<0> and the output signal of the NAND gate 1112. When the logic level of the output control signal POUT<0> is a logic high level and a complementary signal of the output control signal POUTB<0> is a logic low level, the pass gate 1113 may output the output signal of the NAND gate 1112 as the internal command address signals CAO<0:9>.

The second pipe 1120 may receive some command address signals of the command address signal set CA<0:19>, the input control signal PIN<1>, the output control signal POUT<1>, and the reset signal RSTB<1>. The second pipe 1120 may store the command address signals CA<0:9> when the input control signal PIN<1> is enabled. The second pipe 1120 may output the stored command address signals CA<0:9> as the internal command address signal set CAO<0:9> when the output control signal POUT<1> is enabled. The second pipe 1120 may block the stored command address signals CA<0:9> from being output based on the reset signal RSTB<1>. When the reset signal RSTB<1> is in the disable state, the second pipe 1120 may output the stored command address signals CA<0:9> as the internal command address signals CAO<0:9>. When the reset signal RSTB<1> is enabled, the second pipe 1120 may reset the stored command address signals CA<0:9>, and can invalidate the internal command address signals CAO<0:9> by preventing the stored command address signals CA<0:9> from being provided as the internal command address signals CAO<0:9>. The second pipe 1120 may have substantially the same construction as the first pipe 1110.

The third pipe 1130 may receive some command address signals of the command address signal set CA<0:19>, the input control signal PIN<2>, the output control signal POUT<2>, and the reset signal RSTB<2>. The third pipe 1130 may store the command address signals CA<0:9> when the input control signal PIN<2> is enabled. The third pipe 1130 may output the stored command address signals CA<0:9> as the internal command address signals CAO<0:9> when the output control signal POUT<2> is enabled. The third pipe 1130 may block the stored command address signals CA<0:9> from being output based on the reset signal RSTB<2>. When the reset signal RSTB<2> is in the disable state, the third pipe 1130 may output the stored command address signals CA<0:9> as the internal command address signals CAO<0:9>. When the reset signal RSTB<2> is enabled, the third pipe 1130 may reset the stored command address signals CA<0:9>, and can invalidate the internal command address signal set CAO<0:19> by preventing the stored command address signals CA<0:9> form being provided as the internal command address signals CAO<0:9>. The third pipe 1130 may have substantially the same construction as the first pipe 1110.

The sixth pipe 1160 may receive some command address signals of the command address signal set CA<0:19>, the input control signal PIN<5>, the output control signal POUT<5>, and the reset signal RSTB<5>. The sixth pipe 1160 may store the command address signals CA<0:9> when the input control signal PIN<5> is enabled. The sixth pipe 1160 may output the stored command address signals CA<0:9> as the internal command address signals CAO<0:9> when the output control signal POUT<5> is enabled. The sixth pipe 1160 may block the stored command address signals CA<0:9> from being output based on the reset signal RSTB<5>. When the reset signal RSTB<5> is in the disable state, the sixth pipe 1160 may output the stored command address signals CA<0:9> as the internal command address signals CAO<0:9>. When the reset signal RSTB<5> is enabled, the sixth pipe 1160 may reset the stored command address signals CA<0:9>, and can invalidate the internal command address signals CAO<0:9> by preventing the stored command address signals CA<0:9> from being provided as the internal command address signals CAO<0:9>. The sixth pipe 1160 may have substantially the same construction as the first pipe 1110.

Figure 15:
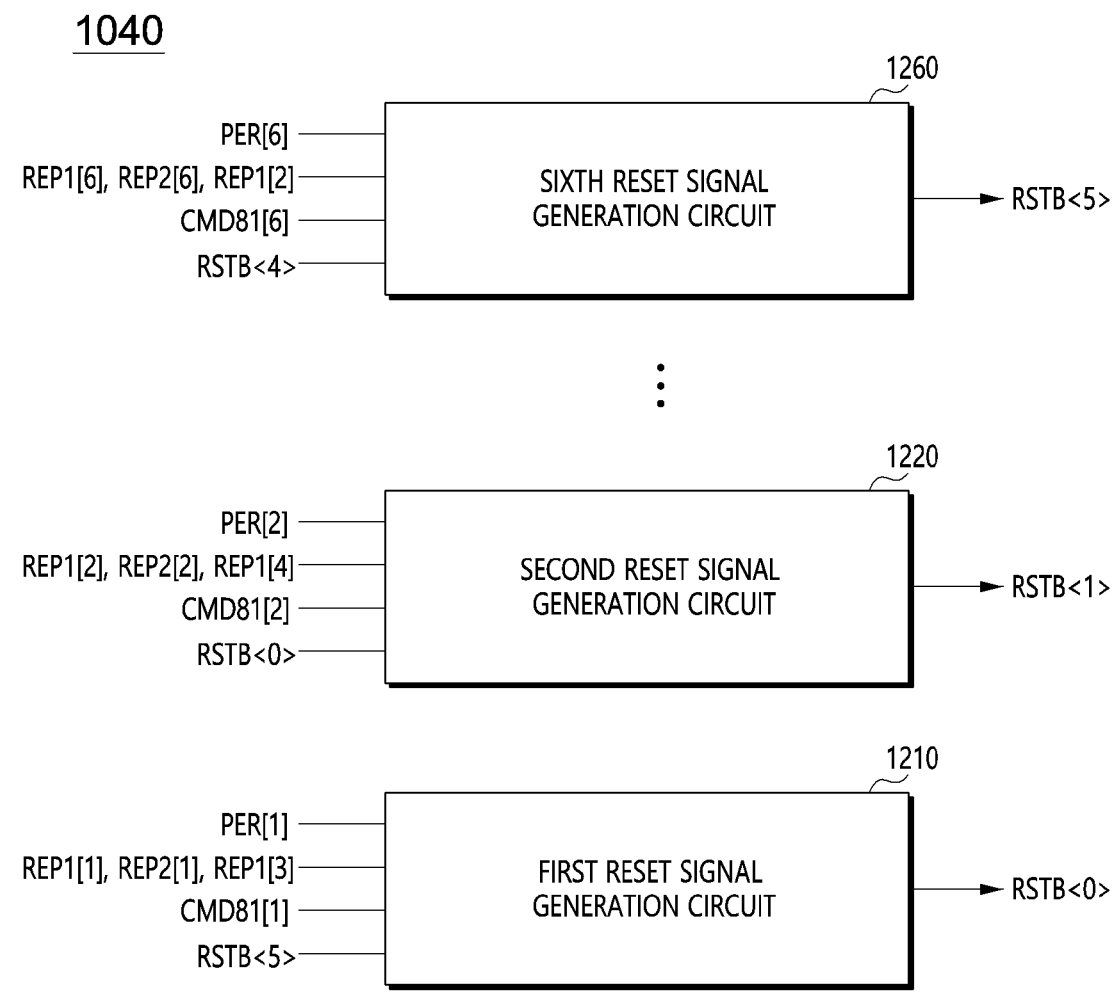
FIG. 15 is a diagram illustrating a configuration of a reset control circuit illustrated in FIG. 13.

FIG. 15 is a diagram illustrating a construction of the reset control circuit 1040 illustrated in FIG. 13. Referring to FIG. 15, the reset control circuit 1040 may include a plurality of reset signal generation circuits. The number of plurality of reset signal generation circuits may be substantially the same as the number of pipes that are included in the first pipe circuit 1050. If the first pipe circuit 1050 includes the first to sixth pipes 1110 to 1160 as in FIG. 14, the reset control circuit 1040 may include first to sixth reset signal generation circuits 1210 to 1260. Each of the first to sixth reset signal generation circuits 1210 to 1260 may generate first to sixth reset signals RSTB<0:5>. The first to sixth reset signal generation circuits 1210 to 1260 may have substantially the same structure except that signals that are received by the first to sixth reset signal generation circuits 1210 to 1260 are different from each other and signals that are output by first to sixth reset signal generation circuits 1210 to 1260 are different from each other. FIG. 15 illustrates the first reset signal generation circuit 1210, the second reset signal generation circuit 1220, and the sixth reset signal generation circuit 1260.

The first reset signal generation circuit 1210 may 1210 may receive the first delay clock signal REP1, the second delay clock signal REP2, the error detection signal PER, the command detection signal CMD81, and the sixth reset signal RSTB<5>. The first reset signal generation circuit 1210 may generate the first reset signal RSTB<0>, based on the first delay clock signal REP1, the second delay clock signal REP2, the error detection signal PER, the command detection signal CMD81, and the sixth reset signal RSTB<5>. In FIG. 15, a letter (e.g., g) within square brackets "[ ]" may mean a g-th turn or period, and may mean a signal that is assigned to a reset signal generation circuit having a corresponding turn, among the plurality of reset signal generation circuits. The g may be one of integers 1 to 6. The first reset signal generation circuit 1210 may receive the first delay clock signal REP1[1] having a first period. The first reset signal generation circuit 1210 may 1210 may receive the second delay clock signal REP2[1] having the first period. The first reset signal generation circuit 1210 may also receive the first delay clock signal REP1[3] having a third period. The first reset signal generation circuit 1210 may receive a first error detection signal PER[1]. The first reset signal generation circuit 1210 may receive a first command detection signal CMD81[1]. The first reset signal generation circuit 1210 may receive the sixth reset signal RSTB<5>. The first reset signal generation circuit 1210 may latch the first error detection signal PER[1] in synchronization with the first delay clock signal REP1[1] having the first period, and may latch the first command detection signal CMD81[1] in synchronization with the second delay clock signal REP2[1] having the first period. The first reset signal generation circuit 1210 may further receive a command detection signal that has been latched by the sixth reset signal generation circuit 1260. The first reset signal generation circuit 1210 can prevent the first command detection signal CMD81[1] from being latched, based on the command detection signal that has been latched by the sixth reset signal generation circuit 1260. The first reset signal generation circuit 1210 may generate the first reset signal RSTB<0>, based on the latched error detection signal, the latched command detection signal, and the first delay clock signal REP1[3] having the third period. When the first error detection signal PER[1] is enabled, the first reset signal generation circuit 1210 may enable the first reset signal RSTB in synchronization with the first delay clock signal REP1[3] having the third period. The first reset signal generation circuit 1210 may further receive an error detection signal that has been latched by the second reset signal generation circuit 1220. When the first command detection signal CMD81[1] is enabled and the error detection signal that has been latched by the second reset signal generation circuit 1220 is enabled, the first reset signal generation circuit 1210 may enable the first reset signal RSTB<0>. The first reset signal generation circuit 1210 may also generate the first reset signal RSTB<0> based on the sixth reset signal RSTB<5>. When the sixth reset signal RSTB<5> is enabled, the first reset signal generation circuit 1210 may enable the first reset signal RSTB<0> regardless of the latched error detection signal and the latched command detection signal.

The second reset signal generation circuit 1220 may receive the first delay clock signal REP1, the second delay clock signal REP2, the error detection signal PER, the command detection signal CMD81, and the first reset signal RSTB<0>. The second reset signal generation circuit 1220 may generate the second reset signal RSTB<1>, based on the first delay clock signal REP1, the second delay clock signal REP2, the error detection signal PER, the command detection signal CMD81, and the first reset signal RSTB<0>. The second reset signal generation circuit 1220 may receive a first delay clock signal REP1[2] having a second period. The second reset signal generation circuit 1220 may receive a second delay clock signal REP2[2] having the second period. The second reset signal generation circuit 1220 may also receive a first delay clock signal REP1[4] having a fourth period. The second reset signal generation circuit 1220 may receive a second error detection signal PER[2]. The second reset signal generation circuit 1220 may receive a second command detection signal CMD81[2]. The second reset signal generation circuit 1220 may receive the first reset signal RSTB<0>. The second reset signal generation circuit 1220 may latch the second error detection signal PER[2] in synchronization with the first delay clock signal REP1[2] having the second period, and may latch the second command detection signal CMD81[2] in synchronization with the second delay clock signal REP2[2] having the second period. The second reset signal generation circuit 1220 may further receive a command detection signal that has been latched by the third reset signal generation circuit. The second reset signal generation circuit 1220 can prevent the second command detection signal CMD81[2] from being latched, based on the command detection signal that has been latched by the third reset signal generation circuit. The second reset signal generation circuit 1220 may generate the second reset signal RSTB<1>, based on the latched error detection signal, the latched command detection signal, and the first delay clock signal REP1[4] having the fourth period. When the second error detection signal PER[2] is enabled, the second reset signal generation circuit 1220 may enable the second reset signal RSTB<1> in synchronization with the first delay clock signal REP1[4] having the fourth period. The second reset signal generation circuit 1220 may further receive an error detection signal that has been latched by the third reset signal generation circuit. When the second command detection signal CMD81[2] is enabled and the error detection signal that has been latched by the third reset signal generation circuit is enabled, the second reset signal generation circuit 1220 may enable the second reset signal RSTB<1>. The second reset signal generation circuit 1220 may also generate the second reset signal RSTB<1> based on the first reset signal RSTB<0>. When the first reset signal RSTB<0> is enabled, the second reset signal generation circuit 1220 may enable the second reset signal RSTB<1> regardless of the latched error detection signal and the latched command detection signal.

The sixth reset signal generation circuit 1260 may receive the first delay clock signal REP1, the second delay clock signal REP2, the error detection signal PER, the command detection signal CMD81, and the fifth reset signal RSTB<4>. The sixth reset signal generation circuit 1260 may generate the sixth reset signal RSTB<5>, based on the first delay clock signal REP1, the second delay clock signal REP2, the error detection signal PER, the command detection signal CMD81, and the fifth reset signal RSTB<4>. The sixth reset signal generation circuit 1260 may receive a first delay clock signal REP1[6] having a sixth period. The sixth reset signal generation circuit 1260 may receive a second delay clock signal REP2[6] having the sixth period. The sixth reset signal generation circuit 1260 may also receive the first delay clock signal REP1[2] having a second period. The sixth reset signal generation circuit may receive a sixth error detection signal PER[6]. The sixth reset signal generation circuit 1260 may receive a sixth command detection signal CMD81[6]. The sixth reset signal generation circuit 1260 may receive the fifth reset signal RSTB<4>. The sixth reset signal generation circuit 1260 may latch the sixth error detection signal PER[6] in synchronization with the first delay clock signal REP1[6] having the sixth period, and may latch the sixth command detection signal CMD81[6] in synchronization with the second delay clock signal REP2[6] having the sixth period. The sixth reset signal generation circuit 1260 may further receive a command detection signal that has been latched by the fifth reset signal generation circuit. The sixth reset signal generation circuit 1260 can prevent the sixth command detection signal CMD81[6] from being latched, based on the command detection signal that has been latched by the fifth reset signal generation circuit. The sixth reset signal generation circuit 1260 may generate the sixth reset signal RSTB<5>, based on the latched error detection signal, the latched command detection signal, and the first delay clock signal REP1[2] having the second period. When the sixth error detection signal PER[6] is enabled, the sixth reset signal generation circuit 1260 may generate the sixth reset signal RSTB<5> in synchronization with the first delay clock signal REP1[2] having the second period. The sixth reset signal generation circuit 1260 may further receive an error detection signal that has been latched by the first reset signal generation circuit 1210. When the sixth command detection signal CMD81[6] is enabled and the error detection signal that has been latched by the first reset signal generation circuit 1210 is enabled, the sixth reset signal generation circuit 1260 may enable the sixth reset signal RSTB<5>. The sixth reset signal generation circuit 1260 may generate the sixth reset signal RSTB<5> based on the fifth reset signal RSTB<4>. When the fifth reset signal RSTB<4> is enabled, the sixth reset signal generation circuit 1260 may enable the sixth reset signal RSTB<5> regardless of the latched error detection signal and the latched command detection signal.

Figure 16:
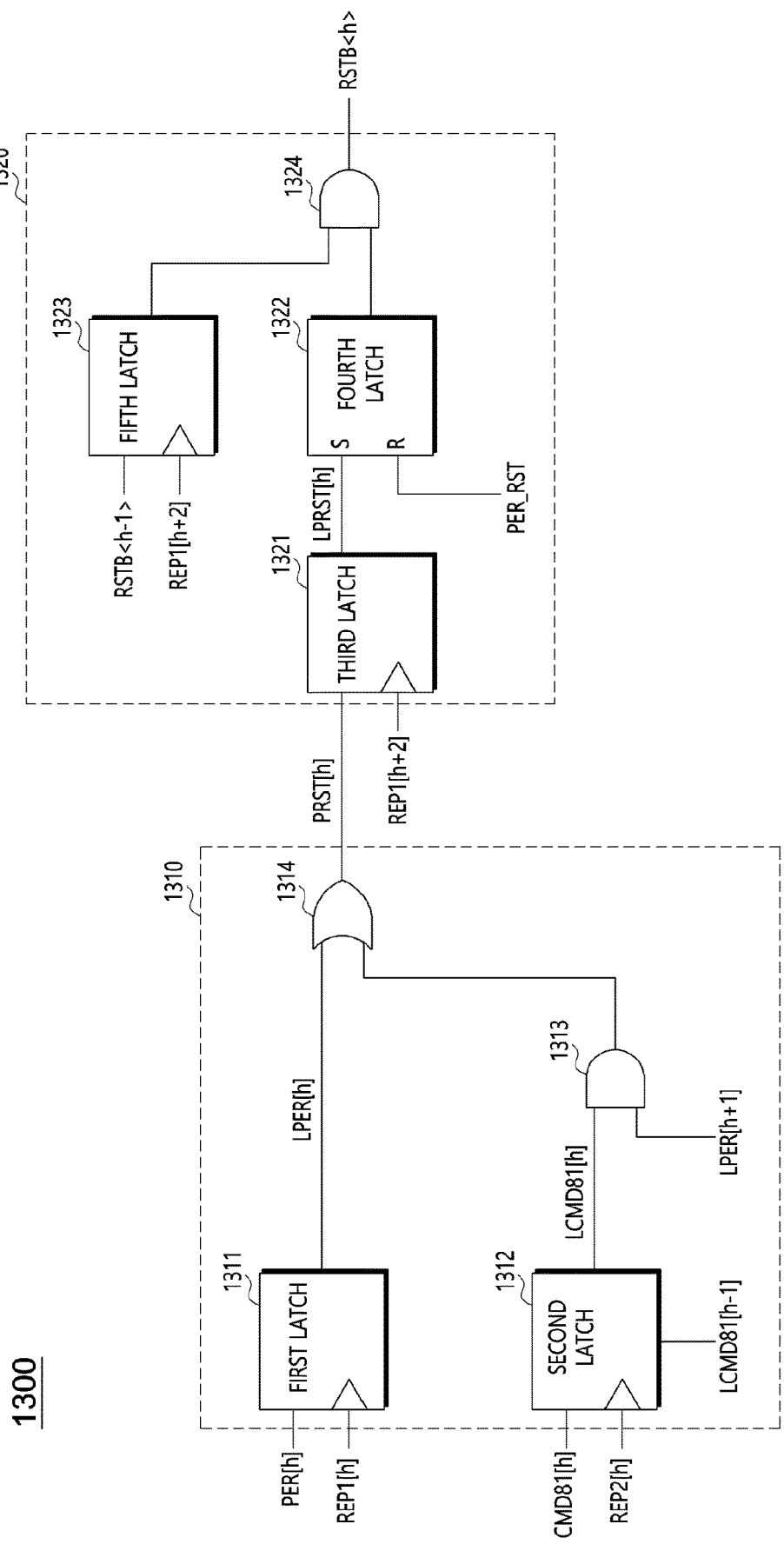
FIG. 16 is a diagram illustrating a configuration of a reset signal generation circuit according to an embodiment.

FIG. 16 is a diagram illustrating a construction of a reset signal generation circuit 1300 according to an embodiment. The reset signal generation circuit 1300 may be applied as each of the first to sixth reset signal generation circuits 1210 to 1260 illustrated in FIG. 15. Referring to FIG. 16, the reset signal generation circuit 1300 may include a preliminary reset signal generation circuit 1310 and a reset signal output circuit 1320. The preliminary reset signal generation circuit 1310 may receive an h-th error detection signal PER[h], an h-th command detection signal CMD81[h], the first delay clock signal REP1[h] having an h-th period, and the second delay clock signal REP2[h] having the h-th period, and may generate a preliminary reset signal PRST[h]. Referring to both FIGS. 13 and 16, the h-th error detection signal PER[h] may be an error detection signal that is generated by detecting, by the parity check circuit 1030, whether an error is present in a currently received command address signal set CA<0:19>. The h-th command detection signal CMD81[h] may be a command detection signal that is generated by the command decoding circuit 1020 based on at least some command address signals of the currently received command address signal set CA<0:19>. If the reset signal generation circuit 1300 is applied as one of the first to sixth reset signal generation circuits 1210 to 1260 of the reset control circuit 1040 illustrated in FIG. 15, h may be one of integers 1 to 6. In this case, when the h is 1, h−1 may be 6.

The preliminary reset signal generation circuit 1310 may latch the h-th error detection signal PER[h] based on the first delay clock signal REP1[h] having the h-th period, and may generate the preliminary reset signal PRST[h] based on a latched error detection signal LPER[h]. The preliminary reset signal generation circuit 1310 may latch the h-th error detection signal PER[h] in synchronization with the first delay clock signal REP1[h] having the h-th period, and may output the latched error detection signal LPER[h] as the preliminary reset signal PRST[h]. When the latched error detection signal LPER[h] is enabled, the preliminary reset signal generation circuit 1310 may enable the preliminary reset signal PRST[h]. The preliminary reset signal generation circuit 1310 may latch the h-th command detection signal CMD81[h] based on the second delay clock signal REP2[h] having the h-th period, and may generate the preliminary reset signal PRST[h] based on the latched command detection signal LCMD81[h]. The reset signal generation circuit 1300 may further receive a latched command detection signal LCMD81[h−1]. The latched command detection signal LCMD81[h−1] may be a signal that is generated by latching, by the command decoding circuit 1020, a (h−1)-th command detection signal CMD81[h−1] generated based on a command address signal set CA<0:19> that was received before the currently received command address signal set CA<0:19> is received. The preliminary reset signal generation circuit 1310 may invalidate the h-th command detection signal CMD81[h] based on the latched command detection signal LCMD81[h−1]. The reset signal generation circuit 1310 may further receive a latched error detection signal LPER[h+1]. The latched error detection signal LPER[h+1] may be a signal that is generated by latching, by the parity check circuit 1030, an error detection signal PER[h+1] generated by detecting whether an error is present in a command address signal set CA<0:19> that is received after the currently received command address signal set CA<0:19> was received. The preliminary reset signal generation circuit 1310 may generate the preliminary reset signal PRST[h], based on the latched command detection signal LCMD81[h] and the latched error detection signal LPER[h+1]. When the latched command detection signal LCMD81[h] and the latched error detection signal LPER [h+1] are enabled, the preliminary reset signal generation circuit 1310 may enable the preliminary reset signal PRST [h].

The reset signal output circuit 1320 may generate an h-th reset signal RSTB<h> by receiving the preliminary reset signal PRST[h] and a first delay clock signal REP1[h+2] having an (h+2)-th period. The reset signal output circuit 1320 may latch the preliminary reset signal PRST[h] in synchronization with the first delay clock signal REP1[h+2] having the (h+2)-th period, and may generate the reset signal RSTB<h> based on a latched preliminary reset signal LPRST[h]. In an embodiment, in order to synchronize the preliminary reset signal PRST[h], the first delay clock signal REP1 or the second delay clock signal REP2 having another period may be used instead of the first delay clock signal REP1[h+2] having the (h+2)-th period. For example, in order to generate the latched preliminary reset signal, the reset signal output circuit 1320 may use any one of the first delay clock signal REP1 or the second delay clock signal REP2 having a rising edge, after the error detection signal PER[h+1] is generated based on a command address signal set CA<0:19> that is received after the currently received command address signal set CA<0:19> was received. When the preliminary reset signal PRST[h] is enabled, the reset signal output circuit 1320 may enable the h-th reset signal RSTB<h>. The reset signal output circuit 1320 may further receive an (h−1)-th reset signal RSTB<h−1>. When the (h−1)-th reset signal RSTB<h−1> is enabled, the reset signal output circuit 1320 may enable the h-th reset signal RSTB<h> regardless of the preliminary reset signal PRST [h]. The reset signal output circuit 1320 may latch the (h−1)-th reset signal RSTB<h−1> in synchronization with the first delay clock signal REP1[h+2] having the (h+2)-th period, and may generate the h-th reset signal RSTB<h> based on the latched reset signal.

The preliminary reset signal generation circuit 1310 may include a first latch 1311, a second latch 1312, a first logic gate 1313, and a second logic gate 1314. An input terminal of the first latch 1311 may receive the h-th error detection signal PER[h]. A clock terminal of the first latch 1311 may receive the first delay clock signal REP1[h] having the h-th period. The latched error detection signal LPER[h] may be output from an output terminal of the first latch 1311. When the h-th error detection signal PER[h] is enabled to a logic high level at a rising edge of the first delay clock signal REP1[h] having the h-th period, the first latch 1311 may enable the latched error detection signal LPER[h] to a logic high level, and may maintain the enable state of the latched error detection signal LPER[h]. An input terminal of the second latch 1312 may receive the h-th command detection signal CMD81[h]. A clock terminal of the second latch 1312 may receive the second delay clock signal REP2[h] having the h-th period. The latched command detection signal LCMD81[h] may be output from an output terminal of the second latch 1312. The second latch 1312 may be reset based on the latched command detection signal LCMD81 [h−1]. When the h-th command detection signal CMD81[h] is enabled to a logic high level at a rising edge of the second delay clock signal REP2[h] having the h-th period, the second latch 1312 may enable the latched command detection signal LCMD81[h] to a logic high level, and may maintain the enable state of the latched command detection signal LCMD81[h]. When the latched command detection signal LCMD81[h−1] is enabled to a logic high level, the second latch 1312 may reset the latched command detection signal LCMD81[h] to a logic low level regardless of the logic level of the h-th command detection signal CMD81[h]. The first logic gate 1313 may receive the latched command detection signal LCMD81[h] and the latched error detection signal LPER[h+1]. When both the latched command detection signal CMD81[h] and the latched error detection signal LPER[h+1] are enabled to a logic high level, the first logic gate 1313 may output a signal that has been enabled to a logic high level. The first logic gate 1313 may be an AND gate. The second logic gate 1314 may receive the latched error detection signal LPER[h] and the output signal of the first logic gate 1313, and may output the preliminary reset signal PRST[h]. When the latched error detection signal LPER[h] is enabled to a logic high level or the output signal of the first logic gate 1313 is enabled to a logic high level, the second logic gate 1314 may enable the preliminary reset signal PRST[h] to a logic high level. The second logic gate 1314 may be an OR gate.

The reset signal output circuit 1320 may include a third latch 1321, a fourth latch 1322, a fifth latch 1323, and a third logic gate 1324. An input terminal of the third latch 1321 may receive the preliminary reset signal PRST[h]. A clock terminal of the third latch 1321 may receive the first delay clock signal REP1[h+2] having the (h+2)-th period. The latched preliminary reset signal LPRST[h] may be output through an output terminal of the third latch 1321. The fourth latch 1322 may be an SR latch. A set terminal S of the fourth latch 1322 may receive the latched preliminary reset signal LPRST[h]. When receiving the latched preliminary reset signal LPRST[h] having a logic high level, the fourth latch 1322 may generate an output signal that is enabled to a logic low level. The fourth latch 1322 may further receive a reset signal PER_RST. A reset terminal R of the fourth latch 1322 may receive the reset signal PER_RST. When the reset signal PER_RST is enabled to a logic high level, the fourth latch 1322 may reset the output signal of the fourth latch 1322 to a logic high level. The reset signal PER_RST may be an arbitrary signal which may be generated within the second semiconductor device 120 illustrated in FIG. 1. For example, when the second semiconductor device 120 is in an operation state in which the second semiconductor device 120 does not receive the command address signal set CA<0:19>, the second semiconductor device 120 may enable the reset signal PER_RST. An input terminal of the fifth latch 1323 may receive the (h−1)-th reset signal RSTB<h−1>. A clock terminal of the fifth latch 1323 may receive the first delay clock signal REP1[h+2] having the (h+2)-th period. When the (h−1)-th reset signal RSTB<h−1> is enabled to a logic low level at a rising edge of the first delay clock signal REP1[h+2] having the (h+2)-th period, the fifth latch 1323 may output an output signal that is enabled to a logic low level through an output terminal of the fifth latch 1323. The third logic gate 1324 may receive the output signals of the fourth latch 1322 and the fifth latch 1323, and may output the h-th reset signal RSTB<h>. When at least one of the fourth latch 1322 and the fifth latch 1323 is enabled to a logic low level, the third logic gate 1324 may enable the h-th reset signal RSTB<h> to a logic low level.

FIG. 17 is a timing diagram illustrating an operation of the command address control circuit 1000 according to an embodiment. An operation of the command address control circuit 1000 according to an embodiment is described as follows with reference to FIGS. 13 to 17. A command address signal set may be received in synchronization with the clock signal WCK. The input control circuit 1011 may generate the reference clock signal CKR as the input control signals PIN<0:5>. The output control circuit 1012 may generate the output control signals POUT<0:5> by delaying the reference clock signal CKR. The first to tenth bit command address signals CA<0:9> may be stored in the first pipe circuit 1050 based on the input control signals PIN<0:5>. The eleventh to twentieth bit command address signals CA<10:19> may be stored in the second pipe circuit 1060 based on the input control signals PIN<0:5>. For example, first to tenth bits A1<0:9> of a command address signal set that is received for the first time may be stored in the first pipe 1110 of the first pipe circuit 1050 in synchronization with the input control signal PIN<0>. First to tenth bits B1<0:9> of a command address signal set that is received for the second time may be stored in the second pipe 1120 of the first pipe circuit 1050 in synchronization with the input control signal PIN<1>. First to tenth bits C1<0:9> of a command address signal set that is input for the third time may be stored in the third pipe 1130 of the first pipe circuit 1050 in synchronization with the input control signal PIN<2>. First to tenth bits D1<0:9> of a command address signal set that is received for the fourth time may be stored in the fourth pipe of the first pipe circuit 1050 in synchronization with the input control signal PIN<3>. First to tenth bits E1<0:9> of a command address signal set that is received for the fifth time may be stored in the fifth pipe of the first pipe circuit 1050 in synchronization with the input control signal PIN<4>. First to tenth bits F1<0:9> of a command address signal set that is received for the sixth time may be stored in the sixth pipe 1160 of the first pipe circuit 1050 in synchronization with the input control signal PIN<5>. First to tenth bits A2<0:9> of a command address signal set that is received for the seventh time may be stored in the first pipe 1110 of the first pipe circuit 1060 again in synchronization with the input control signal PIN<0>. First to tenth bits B2<0:9> of a command address signal set that is received for the eighth time may be stored in the second pipe 1120 of the first pipe circuit 1050 again in synchronization with the input control signal PIN<1>. Eleventh to twentieth bits A1<10:19, B1<10:19>, C1<10:19>, D1<10:19>, E1<10:19>, and F1<10:19> of the command address signal sets that are received for the first time to the sixth time may be sequentially stored in the pipes of the second pipe circuit 1060, respectively.

When a first time T1 elapses from timing at which each of the first to sixth command address signal set A1<0:19>, B1<0:19>, C1<0:19>, D1<0:19>, E1<0:19>, and F1<0:19> was received, the parity check circuit 1030 may sequentially output first to sixth error detection signals PER[1], PER[2], PER[3], PER[4], PER[5], and PER[6]. The delay clock generation circuit 1070 may generate the first delay clock signal REP1 by delaying the reference clock signal CKR by the first time T1, and may generate the second delay clock signal REP2 by delaying the reference clock signal RCK by the second time T2. It is assumed that a command address signal set B1<0:19> that is received for the second time is a command address signal set that is currently received by the command address control circuit 1000. When a second time T2 elapses from timing at which each of the first to tenth bits A1<0:9>, B1<0:9>, C1<0:9>, D1<0:9>, E1<0:9>, and F1<0:9> of the first to sixth command address signal sets was received, the command decoding circuit 1020 may sequentially output first to sixth command detection signals CMD81[1], CMD81[2], CMD81[3], CMD81[4], CMD81[5], and CMD81[6].

1) When the command address signal set B1<0:19> that is received for the second time is a command address signal set having the first type and includes an error.

The parity check circuit 1030 may enable the second error detection signal PER[2] to a logic high level based on the command address signal set B1<0:19> that has been received for the second time. The command decoding circuit 1020 may disable the second command detection signal CMD81[2] to a logic low level. The logic levels of the third error detection signal PER[3] that is generated based on the command address signal set C1<0:19> that is received for the third time and the latched error detection signal LPER[3] that is generated from the third error detection signal PER[3] might not be related. The first reset signal RSTB<0> may have a logic high level. The first latch 1311 of the second reset signal generation circuit 1220 may output the latched error detection signal LPER[2] having a logic high level. The second latch 1312 of the second reset signal generation circuit 1220 may output the latched command detection signal LCMD81[2] having a logic low level. The second logic gate 1314 may 1314 may enable the preliminary reset signal PRST[2] to a logic high level regardless of the output signal of the first logic gate 1313. The third latch 1321 may output the latched preliminary reset signal LPRST[h] having a logic high level. The fourth latch 1322 may enable the second reset signal RSTB<2> by generating an output signal that is enabled to a logic low level. When a time corresponding to latency PL of the command address control circuit 1000 elapses, the output control signals POUT<0:5> may be sequentially generated.

The first reset signal RSTB<1> may be in the disable state. The first pipe 1110 may output the first to tenth bits A1<0:9> of the command address signal set that has been stored in the first pipe 1110 and that has been received for the first time as the first to tenth bits CAO<0:9> of the internal command address signal set in synchronization with the output control signal POUT<0>. When the second reset signal RSTB<1> is enabled, the second pipe 1120 may reset, to a logic high level, the first to tenth bits B1<0:9> of the command address signal set that has been stored in the second pipe 1120 and that has been received for the second time. When receiving the output control signal POUT<1>, the second pipe 1120 can block the first to tenth bits B1<0:9> of the command address signal set that has been stored in the second pipe 1120 and that has been received for the second time from being output as the first to tenth bits CAO<0:9> of the internal command address signal set, by outputting the signals having the logic high level.

When the second reset signal RSTB<1> is enabled, the third reset signal generation circuit may enable the third reset signal RSTB<2> based on the second reset signal RSTB<1>. The fourth reset signal generation circuit, the fifth reset signal generation circuit, and the sixth reset signal generation circuit 1260 may also enable the fourth reset signal RSTB<3>, the fifth reset signal RSTB<4>, and the sixth reset signal RSTB<5>, respectively. Accordingly, all of the first to tenth bits C1<0:9>, D1<0:9>, E1<0:9>, and F1<0:9> of the command address signal sets that have been stored in the third to sixth pipes 1130 to 1160 and that have been received for the third time to for the sixth time, respectively, might not be provided as the first to tenth bits CAO<0:9> of the internal command address signal set. Accordingly, all of the command address signal set B1<0: 19> that includes an error and that has been received for the second time and a command address signal set that is subsequently received may be invalidated without being provided as the internal command address signal set CAO<0:19>.

2) When the command address signal set B1<0:19> that is received for the second time is a command address signal set of a first phase having the second type and includes an error.

The parity check circuit 1030 may enable the second error detection signal PER[2] to a logic high level based on the command address signal set B1<0:19> that has been received for the second time. The command decoding circuit 1020 may enable the second command detection signal CMD81[2] to a logic high level. When the command address signal set B1<0:19> that has been received for the second time is a command address signal set of a first phase having the second type, the command address signal set A1<0:19> that has been received for the first time might not be a command address signal set of a first phase having the second type, and the first command detection signal CMD81[1] may have a logic low level. The first reset signal RSTB<0> may have a logic high level. The first latch 1311 of the second reset signal generation circuit 1220 may output the latched error detection signal LPER[2] having a logic high level. The second latch 1312 of the second reset signal generation circuit 1220 may output the latched command detection signal LCMD81[2] having a logic high level. The second logic gate 1314 of the second reset signal generation circuit 1220 may enable the preliminary reset signal PRST[2] to a logic high level regardless of the output signal of the first logic gate 1313. The third latch 1321 of the second reset signal generation circuit 1220 may output the latched preliminary reset signal LPRST<2> having a logic high level. The fourth latch 1322 of the second reset signal generation circuit 1220 may enable the second reset signal RSTB<1> by generating an output signal that is enabled to a logic low level. When the time corresponding to the latency PL of the command address control circuit 1000 elapses, the output control signals POUT<0:5> may be sequentially generated.

The first reset signal RSTB<0> may be in the disable state. The first pipe 1110 may output the first to tenth bits A1<0:9> of the command address signal set that has been stored in the first pipe 1110 and that has been received for the first time as the first to tenth bits CAO<0:9> of the internal command address signal set in synchronization with the output control signal POUT<0>. When the second reset signal RSTB<1> is enabled, the second pipe 1120 may reset, to a logic high level, the first to tenth bits B1<0:9> of the command address signal set that has been stored in the second pipe 1120 and that has been received for the second time. When receiving the output control signal POUT<1>, the second pipe 1120 can block the first to tenth bits B1<0:9> of the command address signal set that has been stored in the second pipe 1120 and that has been received for the second time from being output as the first to tenth bits CAO<0:9> of the internal command address signal set, by outputting the signals having the logic high level.

When the second reset signal RSTB<1> is enabled, the third reset signal generation circuit may enable the third reset signal RSTB<2> based on the second reset signal RSTB<1>. The fourth reset signal generation circuit, the fifth reset signal generation circuit, and the sixth reset signal generation circuit 1260 may also enable the fourth reset signal RSTB<3>, the fifth reset signal RSTB<4>, and the sixth reset signal RSTB<5>, respectively. Accordingly, all of the first to tenth bits C1<0:9>, D1<0:9>, E1<0:9>, and F1<0:9> of the command address signal sets that have been stored in the third to sixth pipes 1130 to 1160 and that have been received for the third time to for the sixth time, respectively, might not be provided as the first to tenth bits CAO<0:9> of the internal command address signal set. Accordingly, all of the command address signal set B1<0: 19> that includes an error and that has been received for the second time and a command address signal set that is subsequently received may be invalidated without being provided as the internal command address signal set CAO<0:19>.

When the command address signal set B1<0:19> that is received for the second time is a command address signal set of a second phase having the second type and includes an error.

The parity check circuit 1030 may enable the second error detection signal PER[2] to a logic high level based on the command address signal set B1<0:19> that has been received for the second time. The command decoding circuit 1020 may disable the second command detection signal CMD81[2] to a logic low level. Since the command address signal set A1<0:19> that has been received for the first time is a command address signal set of a first phase having the second type, the first command detection signal CMD81[1] may have a logic high level, and the latched command detection signal LCMD81[1] that is generated from the first command detection signal CMD81[1] may have a logic high level. The first reset signal RSTB<0> may have a logic high level. The first latch 1311 of the second reset signal generation circuit 1220 may output the second latched error detection signal LPER[2] having a logic high level. The second latch 1312 of the second reset signal generation circuit 1220 may output the second latched command detection signal LCMD81[2] having a logic low level. The second logic gate 1314 of the second reset signal generation circuit 1220 may enable the preliminary reset signal PRST[2] to a logic high level regardless of the output signal of the first logic gate 1313. The third latch 1321 of the second reset signal generation circuit 1220 may output the latched preliminary reset signal LPRST[2] having a logic high level. The fourth latch 1322 of the second reset signal generation circuit 1220 may enable the second reset signal RSTB<1> by generating an output signal that is enabled to a logic low level. The second latch of the first reset signal generation circuit 1210 may generate the first latched command detection signal LCMD81[1]. The first logic gate of the first reset signal generation circuit 1210 may output a signal that has been enabled to a logic high level, based on the first latched command detection signal LCMD81[1] and the latched error detection signal LPER[2] of the second reset signal generation circuit 1220. Accordingly, the second logic gate of the first reset signal generation circuit 1210 may enable the preliminary reset signal PRST[1] regardless of the latched error detection signal LPER[1]. The fourth latch of the first reset signal generation circuit 1210 may enable the first reset signal RSTB<0> to a logic low level based on the latched preliminary reset signal LPRST[1]. When the time corresponding to the latency PL of the command address control circuit 1000 elapses, the output control signals POUT<0:5> may be sequentially generated.

When the first reset signal RSTB<0> is enabled, the first pipe 1110 may reset, to a logic high level, the first to tenth bits A1<0:9> of the command address signal set that has been stored in the first pipe 1110 and that has been received for the first time. When the output control signal POUT<0> is received, the first pipe 1110 can block the first to tenth bits A1<0:9> of the command address signal set that has been stored in the first pipe 1110 and that has been received for the first time from being output as the first to tenth bits CAO<0:9> of the internal command address signal set, by outputting the signals having the logic high level. When the second reset signal RSTB<1> is enabled, the second pipe 1120 may reset, to a logic high level, the first to tenth bits B1<0:9> of the command address signal set that has been stored in the second pipe 1120 and that has been received for the second time. When receiving the output control signal POUT<1>, the second pipe 1120 can block the first to tenth bits B1<0:9> of the command address signal set that has been stored in the second pipe 1120 and that has been received for the second time from being output as the first to tenth bits CAO<0:9> of the internal command address signal set, by outputting the signals having the logic high level.

When the second reset signal RSTB<1> is enabled, the third reset signal generation circuit may enable the third reset signal RSTB<2> based on the second reset signal RSTB<1>. The fourth reset signal generation circuit, the fifth reset signal generation circuit, and the sixth reset signal generation circuit 1260 may also enable the fourth reset signal RSTB<3>, the fifth reset signal RSTB<4>, and the sixth reset signal RSTB<5>, respectively. Accordingly, all of the first to tenth bits C1<0:9>, D1<0:9>, E1<0:9>, and F1<0:9> of the command address signal sets that have been stored in the third to sixth pipes 1130 to 1160 and that have been received for the third time to for the sixth time, respectively, might not be provided as the first to tenth bits CAO<0:9> of the internal command address signal set. Accordingly, all of the command address signal set B1<0:19> that includes an error and that has been received for the second time, a command address signal set that was previously received, and a command address signal set that is subsequently received may be invalidated without being provided as the internal command address signal set CAO<0:19>.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A command address control circuit comprising:
   a command decoding circuit configured to generate a command detection signal by detecting a type of command address signal set in synchronization with a reference clock signal;
   an error decision circuit configured to generate an error detection signal by detecting whether an error is present in the command address signal set in synchronization with the reference clock signal and to generate a first block signal and a second block signal based on the error detection signal and the command detection signal; and
   a shifting circuit configured to output an internal command address signal set by shifting the command address signal set based on the reference clock signal, the first block signal, and the second block signal.

2. The command address control circuit according to claim 1, wherein the command decoding circuit
   disables the command detection signal when the command address signal set is a command address signal set comprising a first type, and
   enables the command detection signal when the command address signal set is a command address signal set of a first phase comprising a second type.

3. The command address control circuit according to claim 2, wherein the command decoding circuit
   enables a preliminary command detection signal when the command address signal set is the command address signal set of the first phase comprising the second type, and
   enables the command detection signal after one period of the reference clock signal.

4. The command address control circuit according to claim 1, wherein the command decoding circuit generates the command detection signal after first latency from a time at which the command address signal set was received.

5. The command address control circuit according to claim 4, wherein:
   the error decision circuit generates the error detection signal by determining a logic level of the command address signal set after second latency from the time at which the command address signal set was received, and
   the second latency is shorter than the first latency.

6. The command address control circuit according to claim 4, wherein the shifting circuit outputs the command address signal set as the internal command address signal set after a time that is longer than the first latency from the time at which the command address signal set was received.

7. The command address control circuit according to claim 4, wherein:
the error decision circuit comprises:
a parity check circuit configured to generate the error detection signal by determining a logic level of the command address signal set; and
an error signal generation circuit configured to generate the first and second block signals based on the error detection signal and the command detection signal.

8. The command address control circuit according to claim 7, wherein the error signal generation circuit
enables the first block signal when the error detection signal is enabled, and
enables the second block signal when the error detection signal is enabled after the command detection signal is enabled.

9. The command address control circuit according to claim 8, wherein:
the shifting circuit comprises first to the n-th shifters sequentially coupled in series and configured to sequentially store and shift command address signals of the command address signal set in synchronization with the reference clock signal,
the shifting circuit resets the first to (n−1)-th shifters based on the first block signal, resets the n-th shifter based on the second block signal, and
the n is an integer greater than the first latency.

10. A command address control circuit comprising:
a command decoding circuit configured to receive a command address signal set in synchronization with a first reference clock signal and to generate a command detection signal by detecting a type of command address signal set based on at least one bit of the command address signal set;
an error decision circuit configured to generate an error detection signal by detecting whether an error is present in the command address signal set in synchronization with the first reference clock signal and a second reference clock signal and to generate a first block signal and a second block signal based on the error detection signal and the command detection signal;
a first shifting circuit configured to generate a half of internal command address signals of an internal command address signal set by shifting a half of command address signals of the command address signal set based on the first reference clock signal, the first block signal, and the second block signal; and
a second shifting circuit configured to generate the other half of internal command address signals of the internal command address signal set by shifting the other half of command address signals of the command address signal set based on the second reference clock signal.

11. The command address control circuit according to claim 10, wherein the command decoding circuit
disables the command detection signal when the command address signal set is a command address signal set comprising a first type, and
enables the command detection signal when the command address signal set is a command address signal set of a first phase comprising a second type.

12. The command address control circuit according to claim 10, wherein the command decoding circuit
enables the preliminary command detection signal when the command address signal set is a command address signal set of a first phase comprising a second type, and
enables the command detection signal after one period of the first reference clock signal.

13. The command address control circuit according to claim 10, wherein the command decoding circuit generates the command detection signal after first latency from a time at which the at least one bit of command address signals of the command address signal set were received.

14. The command address control circuit according to claim 13, wherein:
the error decision circuit generates the error detection signal by determining a logic level of the command address signal set after second latency from the time at which the command address signal set was received, and
the second latency is shorter than the first latency.

15. The command address control circuit according to claim 13, wherein the first shifting circuit outputs the command address signal set as the half of internal command address signals of the internal command address signal set after a time that is longer than the first latency from the time at which the at least one bit of command address signals of the command address signal set were received.

16. The command address control circuit according to claim 10, wherein the error decision circuit comprises:
a parity check circuit configured to generate the error detection signal by determining a logic level of the command address signal set; and
an error signal generation circuit configured to generate the first and second block signals based on the error detection signal and the command detection signal.

17. The command address control circuit according to claim 16, wherein the error signal generation circuit
enables the first block signal when the error detection signal is enabled, and
enables the second block signal when the error detection signal is enabled after the command detection signal was enabled.

18. The command address control circuit according to claim 10, wherein:
the first shifting circuit comprises first to n-th shifters sequentially coupled in series and configured to sequentially store and shift the half of command address signals of the command address signal set in synchronization with the first reference clock signal,
the first shifting circuit resets the first to (n−1)-th shifters based on the first block signal, resets the n-th shifter based on the second block signal, and
the n is an integer that is greater than longer latency among latency of the command decoding circuit and latency of the error decision circuit.

19. A command address control circuit comprising:
a pipe control circuit configured to generate an input control signal and an output control signal based on a reference clock signal;
a command decoding circuit configured to generate a command detection signal by detecting a type of command address signal set based on the command address signal set;
a parity check circuit configured to generate an error detection signal by detecting whether an error is present in the command address signal set;
a delay clock generation circuit configured to generate a first delay clock signal and a second delay clock signal by delaying the reference clock signal;
a reset control circuit configured to generate a reset signal, based on the first delay clock signal, the second delay clock signal, the error detection signal, and the command detection signal; and a pipe circuit configured to store the command address signal set based on the input control signal, to output the stored command address signal set as an internal command address signal set based on the output control signal, and to invalidate the stored command address signal set based on the reset signal.

20. The command address control circuit according to claim 19, wherein the command decoding circuit
maintains a state of the command detection signal to a disable state when the command address signal set is a command address signal set comprising a first type or a command address signal set of a second phase comprising a second type, and
enables the command detection signal when the command address signal set is a command address signal set of a first phase comprising the second type.

21. The command address control circuit according to claim 19, further comprising a delay clock generation circuit configured to generate a first delay clock signal by delaying the reference clock signal by a first time and to generate a second delay clock signal by delaying the reference clock signal by a second time,
wherein the reset control circuit generates the reset signal based on the first and second delay clock signals.

22. The command address control circuit according to claim 21, wherein:
the first time corresponds to a time from a time at which the parity check circuit receives the command address signal set to a time at which the parity check circuit generates the error detection signal, and
the second time corresponds to a time from a time at which the command decoding circuit receives the command address signal set to a time at which the command decoding circuit generates the command detection signal.

23. The command address control circuit according to claim 19, wherein:
the pipe circuit comprises first to m-th pipes and sequentially stores first to m-th command address signal sets in the first to m-th pipes whenever the input control signal is enabled,
the reset signal comprises first to m-th reset signals that are provided to the first to m-th pipes, respectively,
the reset control circuit enables k-th to m-th reset signals when the error detection signal generated based on a k-th command address signal set is enabled,
the m is an integer equal to or greater than 3, and
the k is an integer between 1 and the m.

24. The command address control circuit according to claim 23, wherein:
the reset control circuit enables (j−1)-th to m-th reset signals when the error detection signal generated based on a j-th command address signal set is enabled and the command detection signal generated based on (j−1)-th command address signal set is enabled, and
the j is an integer between 2 and the m.

25. The command address control circuit according to claim 23, wherein the pipe circuit
outputs the command address signal set that has been stored in the first to m-th pipes as the internal command address signal set whenever the output control signal is enabled, and
blocks the command address signal set that has been stored in the k-th to m-th pipes from being provided as the internal command address signal set when the k-th reset signal is enabled.

* * * * *